US012695435B2

(12) United States Patent
Daimon

(10) Patent No.: US 12,695,435 B2
(45) Date of Patent: Jul. 28, 2026

(54) ACOUSTIC WAVE DEVICE AND FILTER DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 172 days.

(21) Appl. No.: 18/415,709

(22) Filed: Jan. 18, 2024

(65) Prior Publication Data
US 2024/0154596 A1 May 9, 2024

Related U.S. Application Data

(63) Continuation of application No. PCT/JP2022/026998, filed on Jul. 7, 2022.
(Continued)

(51) Int. Cl.
*H03H 9/02* (2006.01)
*H03H 9/13* (2006.01)
(Continued)

(52) U.S. Cl.
CPC .... *H03H 9/02086* (2013.01); *H03H 9/02031* (2013.01); *H03H 9/02228* (2013.01);
(Continued)

(58) Field of Classification Search
CPC ........... H03H 9/02086; H03H 9/02031; H03H 9/02228; H03H 9/132; H03H 9/173;
(Continued)

(56) References Cited

U.S. PATENT DOCUMENTS

| | | |
|---|---|---|
| 5,853,601 A | 12/1998 | Krishaswamy et al. |
| 6,292,071 B1 | 9/2001 | Taniguchi |

(Continued)

FOREIGN PATENT DOCUMENTS

| | | |
|---|---|---|
| JP | 2000165197 A | 6/2000 |
| JP | 2004096677 A | 3/2004 |

(Continued)

OTHER PUBLICATIONS

International Search Report in PCT/JP2022/026998, mailed Sep. 27, 2022, 4 pages.
(Continued)

*Primary Examiner* — Jorge L Salazar, Jr.
(74) *Attorney, Agent, or Firm* — Keating & Bennett, LLP

(57) ABSTRACT

An acoustic wave device includes a support, a piezoelectric layer on the support, and an IDT electrode on the piezoelectric layer and includes a pair of busbars and electrode fingers. The support includes an acoustic reflection portion overlapping at least a portion of the IDT electrode. d/p is about 0.5 or less. Some of the electrode fingers are connected to one of the busbars, others of the electrode fingers are connected to another of the busbars. When viewed from a direction in which adjacent electrode fingers face each other, a region where the adjacent electrode fingers overlap each other is an intersection region. A region between the intersection region and the pair of busbars includes a pair of gap regions. A mass addition film is provided in at least a portion of at least one of the gap regions.

22 Claims, 24 Drawing Sheets

Related U.S. Application Data

(60) Provisional application No. 63/224,080, filed on Jul. 21, 2021.

(51) Int. Cl.
 *H03H 9/17* (2006.01)
 *H03H 9/56* (2006.01)

(52) U.S. Cl.
 CPC ............ *H03H 9/132* (2013.01); *H03H 9/173* (2013.01); *H03H 9/175* (2013.01); *H03H 9/176* (2013.01); *H03H 9/568* (2013.01)

(58) Field of Classification Search
 CPC ........ H03H 9/175; H03H 9/176; H03H 9/568; H03H 9/02157
 USPC .................................................. 333/193–196
 See application file for complete search history.

(56) References Cited

U.S. PATENT DOCUMENTS

| | | |
|---|---|---|
| 7,463,118 B2 | 12/2008 | Jacobsen |
| 7,684,109 B2 | 3/2010 | Godshalk et al. |
| 7,868,519 B2 | 1/2011 | Umeda |
| 8,278,802 B1 | 10/2012 | Lee et al. |
| 9,219,466 B2 | 12/2015 | Meltaus et al. |
| 9,748,923 B2 | 8/2017 | Kando et al. |
| 9,780,759 B2 | 10/2017 | Kimura et al. |
| 10,491,192 B1 | 11/2019 | Plesski et al. |
| 10,601,392 B2 | 3/2020 | Plesski et al. |
| 10,756,697 B2 | 8/2020 | Plesski et al. |
| 10,790,802 B2 | 9/2020 | Yantchev et al. |
| 10,797,675 B2 | 10/2020 | Plesski |
| 11,146,231 B2 | 10/2021 | Plesski |
| 2004/0041496 A1 | 3/2004 | Imai et al. |
| 2004/0207485 A1 | 10/2004 | Kawachi et al. |
| 2006/0152107 A1 | 7/2006 | Tanaka |
| 2007/0188047 A1 | 8/2007 | Tanaka |
| 2007/0194863 A1 | 8/2007 | Shibata et al. |
| 2010/0064492 A1 | 3/2010 | Tanaka |
| 2014/0001919 A1 | 1/2014 | Komatsu et al. |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0312994 A1 | 10/2014 | Meltaus et al. |
| 2015/0333730 A1 | 11/2015 | Meltaus et al. |
| 2016/0182009 A1 | 6/2016 | Bhattacharjee |
| 2017/0005638 A1 | 1/2017 | Otagawa et al. |
| 2017/0063332 A1 | 3/2017 | Gilbert et al. |
| 2017/0170808 A1 | 6/2017 | Iwaki et al. |
| 2017/0187352 A1 | 6/2017 | Omura |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2019/0123713 A1 | 4/2019 | Daimon |
| 2019/0386637 A1 | 12/2019 | Plesski et al. |
| 2020/0304091 A1 | 9/2020 | Yantchev |
| 2020/0328727 A1 | 10/2020 | Daimon |
| 2020/0328728 A1 | 10/2020 | Nakagawa et al. |
| 2021/0006228 A1 | 1/2021 | Garcia |
| 2021/0273632 A1 | 9/2021 | Yantchev et al. |
| 2021/0288628 A1* | 9/2021 | Nishimura ......... H03H 9/02834 |
| 2022/0116021 A1 | 4/2022 | Yokoyama |
| 2022/0182037 A1 | 6/2022 | Daimon et al. |
| 2022/0216842 A1 | 7/2022 | Nagatomo et al. |
| 2025/0015779 A1 | 1/2025 | Yamaji et al. |

FOREIGN PATENT DOCUMENTS

| | | |
|---|---|---|
| JP | 2007251910 A | 9/2007 |
| JP | 2010220204 A | 9/2010 |
| JP | 2016026444 A | 2/2016 |
| JP | 2017112603 A | 6/2017 |
| JP | 2019080093 A | 5/2019 |
| WO | 2012137027 A1 | 10/2012 |
| WO | 2015156232 A1 | 10/2015 |
| WO | 2019138810 A1 | 7/2019 |
| WO | 2019139076 A1 | 7/2019 |
| WO | 2020092414 A2 | 5/2020 |
| WO | 2020262388 A1 | 12/2020 |
| WO | 2021039639 A1 | 3/2021 |
| WO | 2021060523 A1 | 4/2021 |
| WO | 2023190610 A1 | 10/2023 |

OTHER PUBLICATIONS

Written Opinion in PCT/JP2022/026998, mailed Sep. 27, 2022, 5 pages.

International Search Report and Written Opinion for PCT Application No. PCT/US2019/058632, mailed Jan. 17, 2020, 8 pages.

Kadota et al., "Wideband acoustic wave resonators composed of hetero acoustic layer structure", Japanese Journal of Applied Physics 57.07LD12, Jun. 5, 2018, 5 pages.

Ekeom et al., "Solidly Mounted Resonator (SMR) FEM-BEM Simulation", Proceedings of the IEEE Ultrasonics Symposium, Nov. 2006, 4 pages.

Pang et al., "Analytical and experimental study on the second harmonic mode response of a bulk acoustic wave resonator", Journal of Micromechanics and Microengineering vol. 20, Oct. 15, 2010, 11 pages.

* cited by examiner

REGION OF
EXPRESSION (2)

REGION OF
EXPRESSION
(1)

REGION OF
EXPRESSION (3)

REGION OF
EXPRESSION (2)

ACOUSTIC WAVE DEVICE AND FILTER DEVICE

CROSS REFERENCE TO RELATED APPLICATIONS

This application claims the benefit of priority to Provisional Application No. 63/224,080 filed on Jul. 21, 2021 and is a Continuation application of PCT Application No. PCT/JP2022/026998 filed on Jul. 7, 2022. The entire contents of each application are hereby incorporated herein by reference.

BACKGROUND OF THE INVENTION

1. Field of the Invention

The present invention relates to acoustic wave devices and filter devices.

2. Description of the Related Art

In the related art, an acoustic wave device is widely used, for example, in a filter of a mobile phone.

In recent years, an acoustic wave device using a bulk wave of a thickness shear mode as described in U.S. Pat. No. 10,491,192 below is proposed. In the acoustic wave device, a piezoelectric layer is provided on a support. A pair of electrodes are provided on the piezoelectric layer. The pair of electrodes face each other on the piezoelectric layer and are connected to different potentials from each other. A bulk wave of the thickness shear mode is excited by applying an AC voltage between the electrodes.

In an acoustic wave device using a bulk wave of a thickness shear mode as described in U.S. Pat. No. 10,491, 192, when rotated Y-cut lithium niobate is used for a piezoelectric layer, an unnecessary wave may be generated between a resonant frequency and an anti-resonant frequency. When the unnecessary wave is suppressed, an insertion loss tends to increase. Therefore, it is difficult to achieve both the suppression of the unnecessary wave and the suppression of the increase in the insertion loss.

SUMMARY OF THE INVENTION

Example embodiments of the present invention provide acoustic wave devices and filter devices that are each able to reduce or prevent unnecessary waves and reduce or prevent an increase in insertion loss.

An acoustic wave device according to an example embodiment of the present invention includes a support including a support substrate, a piezoelectric layer on the support and being a rotated Y-cut lithium niobate layer, and an IDT electrode on the piezoelectric layer and including a pair of busbars and a plurality of electrode fingers. The support includes an acoustic reflection portion overlapping at least a portion of the IDT electrode in plan view. d/p is about 0.5 or less, when a thickness of the piezoelectric layer is d and a center-to-center distance of adjacent electrode fingers is p. Some of the plurality of electrode fingers are connected to one of the busbars of the IDT electrode, others of the plurality of electrode fingers are connected to the other of the busbars, and the some of the plurality of electrode fingers connected to the one of the busbars and the others of the plurality of electrode fingers connected to the other of the busbars are interdigitated with each other. When viewed from a direction in which adjacent electrode fingers face each other, a region where the adjacent electrode fingers overlap each other is an intersection region and a region located between the intersection region and the pair of busbars is a pair of gap regions. A mass addition film is provided in at least a portion of at least one of the pair of gap regions.

A filter device according to an example embodiment of the present invention includes at least one series arm resonator, and at least one parallel arm resonator. The series arm resonator and the parallel arm resonator each include an acoustic wave device according to an example embodiment of the present invention. A thickness of the mass addition film of the at least one parallel arm resonator is smaller than a thickness of the mass addition film of the at least one series arm resonator.

According to example embodiments of the present invention, it is possible to provide acoustic wave devices and filter devices that are each able to reduce or prevent unnecessary waves and reduce or prevent an increase in insertion loss.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, the present invention will be clarified by describing example embodiments of the present invention with reference to the accompanying drawings.

Each example embodiment described in the present speci-fication is an example, and partial replacement or combina-tion of configurations is possible between different example embodiments.

Figure 1:
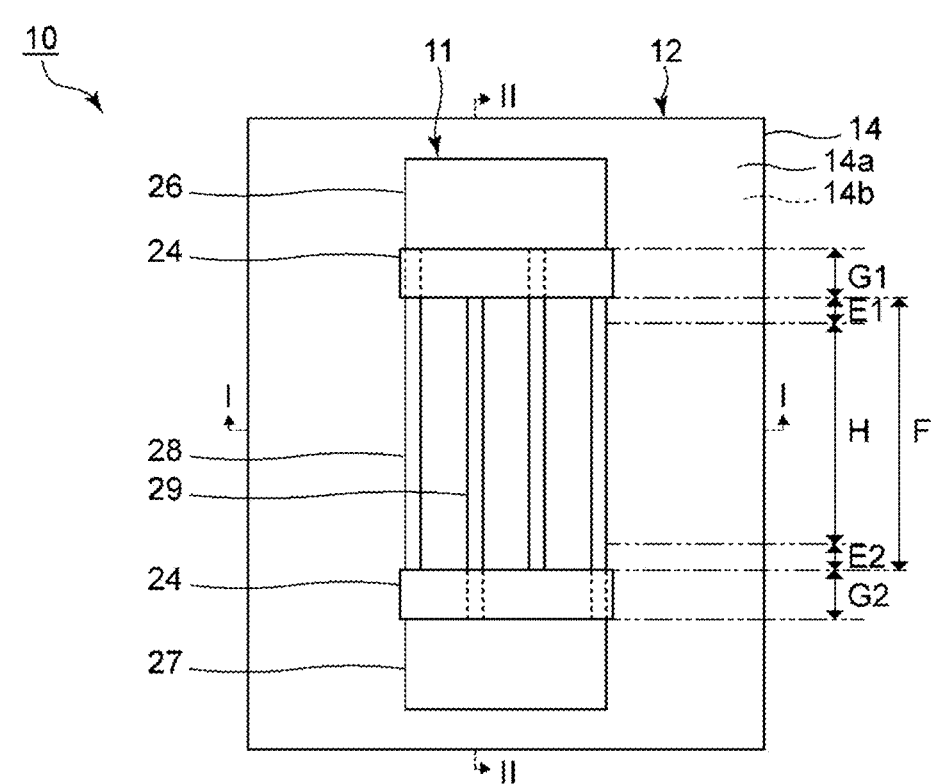
FIG. 1 is a schematic plan view of an acoustic wave device according to a first example embodiment of the present invention.
Figure 2:
FIG. 2 is a schematic sectional view taken along line I-I in FIG. 1.
Figure 2:
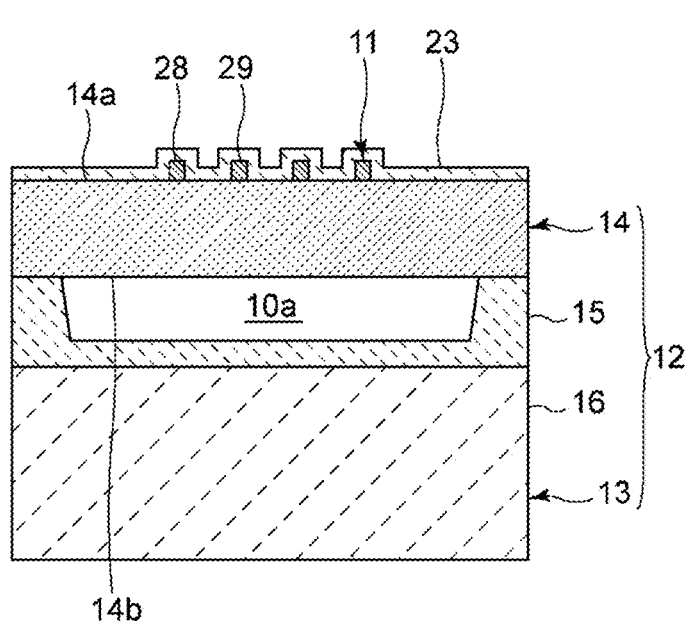

FIG. 1 is a schematic plan view of an acoustic wave device according to a first example embodiment of the present invention. FIG. 2 is a schematic sectional view taken along line I-I in FIG. 1. A protective film, which will be described later, is omitted in FIG. 1. The same applies to schematic plan views other than FIG. 1.

As illustrated in FIG. 1, an acoustic wave device 10 includes a piezoelectric substrate 12 and an IDT electrode 11. As illustrated in FIG. 2, the piezoelectric substrate 12 includes a support 13 and a piezoelectric layer 14. In the present example embodiment, the support 13 includes a support substrate 16 and an insulating layer 15. The insulating layer 15 is provided on the support substrate 16. The piezoelectric layer 14 is provided on the insulating layer 15. However, the support 13 may include only the support substrate 16.

The piezoelectric layer 14 includes a first main surface 14a and a second main surface 14b. The first main surface 14a and the second main surface 14b face each other. In the first main surface 14a and the second main surface 14b, the second main surface 14b is located on a support 13 side.

As a material of the support substrate 16, for example, a semiconductor such as silicon, or ceramics such as aluminum oxide, or the like can be used. As a material of the insulating layer 15, for example, an appropriate dielectric such as silicon oxide or tantalum oxide can be used. The piezoelectric layer 14 is, for example, a rotated Y-cut lithium niobate layer, such as a rotated Y-cut LiNbO₃ layer.

As illustrated in FIG. 2, the support 13 includes a cavity portion 10a. More specifically, the insulating layer 15 includes a recess portion. The piezoelectric layer 14 is provided on the insulating layer 15 so as to close the recess portion. The cavity portion 10a is thus provided. However, the cavity portion 10a may be provided over the insulating layer 15 and the support substrate 16 or may be provided only in the support substrate 16. The cavity portion 10a may be a through-hole provided in the support 13.

An IDT electrode 11 is provided on the first main surface 14a of the piezoelectric layer 14. At least a portion of the IDT electrode 11 overlaps the cavity portion 10a of the support 13 in plan view. In the present specification, plan view means viewing from a direction corresponding to an upper side in FIG. 2. In FIG. 2, for example, in the support substrate 16 and the piezoelectric layer 14, the piezoelectric layer 14 side is the upper side.

As illustrated in FIG. 1, the IDT electrode 11 includes a pair of busbars and a plurality of electrode fingers. The pair of busbars include a first busbar 26 and a second busbar 27. The first busbar 26 and the second busbar 27 face each other. The plurality of electrode fingers include a plurality of first electrode fingers 28 and a plurality of second electrode fingers 29. One end of each of the plurality of first electrode fingers 28 is respectively connected to the first busbar 26. One end of each of the plurality of second electrode fingers 29 are respectively connected to the second busbar 27. The plurality of first electrode fingers 28 and the plurality of second electrode fingers 29 are interdigitated with each other. The IDT electrode 11 may be made of a single-layered metal film or may be made of a laminated metal film.

Hereinafter, the first electrode finger 28 and the second electrode finger 29 may be simply described as an electrode finger. When a direction in which the plurality of electrode fingers extend is defined as an electrode finger extending direction, and a direction in which adjacent electrode fingers face each other is defined as an electrode finger facing direction, in the present example embodiment, the electrode finger extending direction and the electrode finger facing direction are orthogonal or substantially orthogonal to each other.

The acoustic wave device 10 of the present example embodiment is an acoustic wave resonator configured to be able to use a bulk wave of a thickness shear mode. In the acoustic wave device 10, when the thickness of the piezoelectric layer 14 is d and the center-to-center distance of adjacent electrode fingers is p, d/p is about 0.5 or less, for example. As a result, the bulk wave of the thickness shear mode is favorably excited.

The cavity portion 10a of the support 13 illustrated in FIG. 2 is an acoustic reflection portion. Energy of the acoustic wave can be effectively confined on the piezoelectric layer 14 side by the acoustic reflection portion. As the acoustic reflection portion, an acoustic multilayer film, which will be described later, may be provided.

Returning to FIG. 1, the IDT electrode 11 includes an intersection region F. The intersection region F is a region where the adjacent electrode fingers overlap each other when viewed from the electrode finger facing direction. The intersection region F includes a central region H and a pair of edge regions. The pair of edge regions include a first edge region E1 and a second edge region E2. The first edge region E1 and the second edge region E2 sandwich the central region H in the electrode finger extending direction. The first edge region E1 is located on a first busbar 26 side. The second edge region E2 is located on a second busbar 27 side.

The IDT electrode 11 includes a pair of gap regions. The pair of gap regions are located between the intersection region F and the pair of busbars. The pair of gap regions include a first gap region G1 and a second gap region G2. The first gap region G1 is located between the first busbar 26 and the first edge region E1. The second gap region G2 is located between the second busbar 27 and the second edge region E2.

As illustrated in FIG. 2, a protective film 23 is provided on the first main surface 14a of the piezoelectric layer 14 so as to cover the IDT electrode 11. The protective film 23 is provided to overlap the entire IDT electrode 11 in plan view. The protective film 23 is also provided at a portion between the electrode fingers on the first main surface 14a and in each of the gap regions. In the present example embodiment, the protective film 23 is made of, for example, silicon oxide. In the present specification, the fact that a certain member is made of a certain material includes a case where a trace amount of impurity is included to the extent that the electric characteristics of the acoustic wave device do not significantly deteriorate. The material of the protective film 23 is not limited to the above, and for example, a dielectric such as silicon nitride can be used. However, the protective film 23 is not necessarily provided.

As illustrated in FIG. 1, the acoustic wave device 10 includes a pair of mass addition films 24. The mass addition film 24 is a first mass addition film. One mass addition film 24 is provided in each of the first gap region G1 and the second gap region G2.

Figure 3:
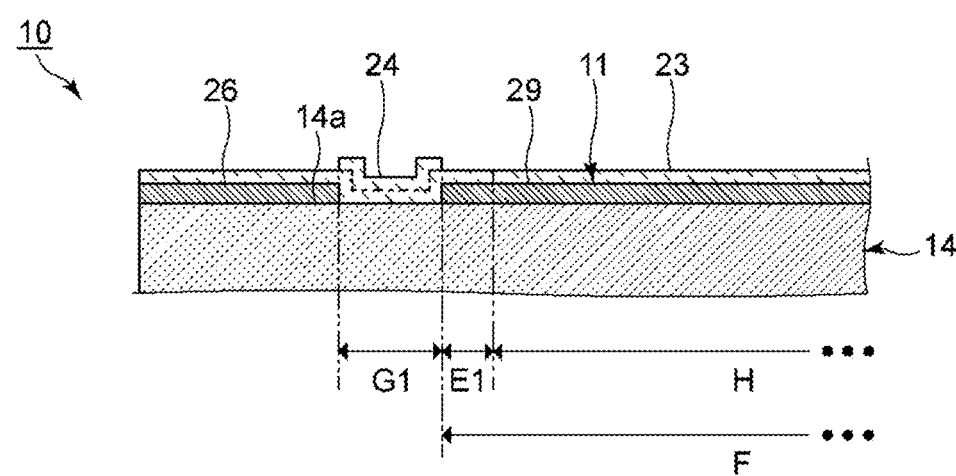
FIG. 3 is a schematic sectional view illustrating the vicinity of a first gap region along line II-II in FIG. 1.

FIG. 3 is a schematic sectional view illustrating the vicinity of the first gap region along line II-II in FIG. 1.

In the present example embodiment, the mass addition film 24 is provided on the protective film 23. However, the mass addition film 24 may be directly provided on the first main surface 14a of the piezoelectric layer 14 or the electrode finger. The protective film 23 may be provided on the mass addition film 24. Each mass addition film 24 is not provided in each edge region.

The mass addition film 24 and the protective film 23 are integrally defined by the same material. A one-dot chain line in FIG. 3 indicates a boundary between the mass addition film 24 and the protective film 23. In the present example embodiment, the mass addition film 24 and the protective film 23 are made of, for example, silicon oxide. The mass addition film 24 and the protective film 23 may be made of materials different from each other.

Returning to FIG. 1, each mass addition film 24 has a belt shape. Each mass addition film 24 is provided over each entire or substantially entire gap region. However, in the acoustic wave device of the present example embodiment, the mass addition film may be provided in at least a portion of at least one of the pair of gap regions.

In the present example embodiment, the piezoelectric layer 14 is a rotated Y-cut lithium niobate layer, d/p is, for example, about 0.5 or less, and each of the mass addition films 24 is provided in each of the gap regions. Accordingly, unnecessary waves in the acoustic wave device 10 using the bulk wave of the thickness shear mode, in which the rotated Y-cut lithium niobate layer is used as the piezoelectric layer 14, can be reduced or prevented. In addition, it is possible to reduce or prevent the increase in the insertion loss. The details will be described below by comparing the present example embodiment and a first comparative example.

The first comparative example is different from the first example embodiment in that no mass addition film is provided. Similarly to the acoustic wave device of the first example embodiment, the acoustic wave device of the first comparative example uses the bulk wave of the thickness shear mode. The admittance frequency characteristics of the acoustic wave devices of the first example embodiment and the first comparative example were compared. In the comparison, the piezoelectric layers of the first example embodiment and the first comparative example were about 157° rotated Y-cut lithium niobate layers.

Figure 4:
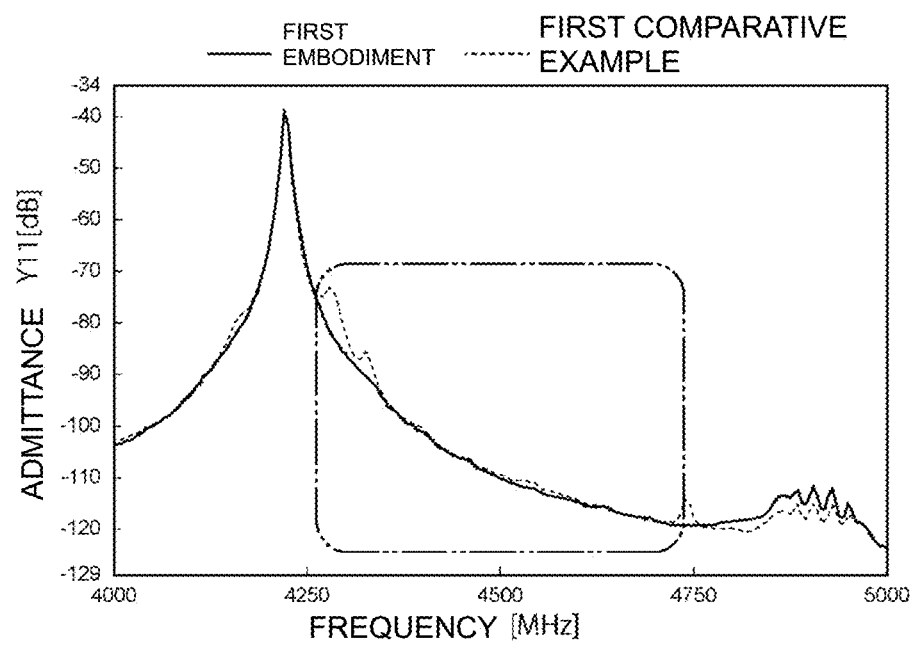
FIG. 4 is a diagram illustrating an admittance frequency characteristic in the first example embodiment of the present invention and a first comparative example.

FIG. 4 is a diagram illustrating the admittance frequency characteristic in the first example embodiment and the first comparative example. The smaller the admittance in the band surrounded by a two-dot chain line in FIG. 4, the smaller the insertion loss is.

As illustrated in FIG. 4, in the first comparative example, a ripple is generated between the resonant frequency and the anti-resonant frequency. The ripple is due to unnecessary waves generated in the gap region. The unnecessary wave is an unnecessary wave in the acoustic wave device using the bulk wave of the thickness shear mode, in which the rotated Y-cut lithium niobate layer is used as the piezoelectric layer. On the other hand, in the first example embodiment, the ripple that is generated in the first comparative example is reduced or prevented. From this, it can be seen that the above-described unnecessary wave can be reduced or prevented in the first example embodiment. Further, in the band surrounded by the two-dot chain line, the admittance of the first example embodiment is equivalent to the admittance of the first comparative example. Therefore, in the first example embodiment, it is possible to reduce or prevent the unnecessary wave and to reduce or prevent the increase in the insertion loss, simultaneously.

On the other hand, in the first comparative example, it is not possible to reduce or prevent the unnecessary wave and to reduce or prevent the increase in the insertion loss, simultaneously. The details thereof will be described below.

A plurality of acoustic wave devices of the first comparative example in which widths of the gap regions are different from each other were prepared. The width of the gap region is a dimension along the electrode finger extending direction of the gap region. In each acoustic wave device, the width of the first gap region and the width of the second gap region are the same or substantially the same. The impedance frequency characteristic and the admittance frequency characteristic of each of the prepared acoustic wave devices were measured. Design parameters of the acoustic wave device of the first comparative example are as follows. Here, a wavelength defined by the wavelength of the IDT electrode is defined as A.

Figure 5:
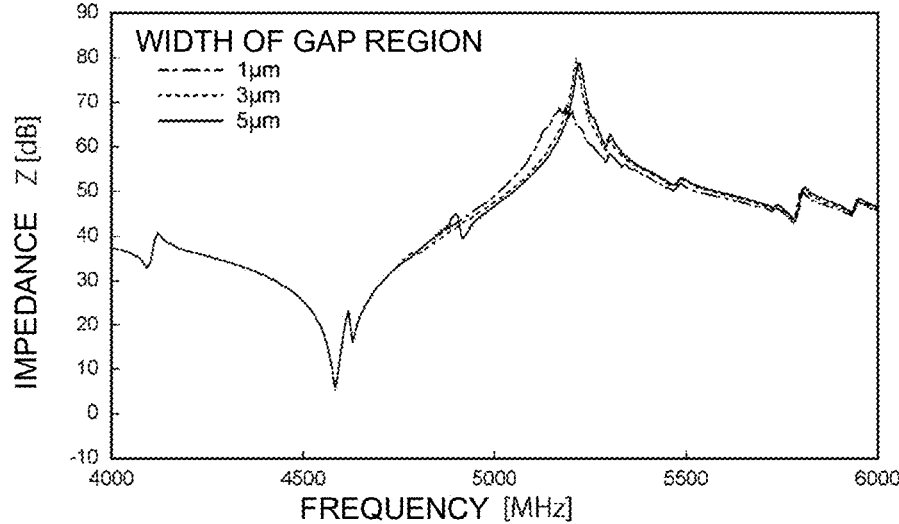
FIG. 5 is a diagram illustrating a relationship between a width of a gap region and an impedance frequency characteristic.
Figure 6:
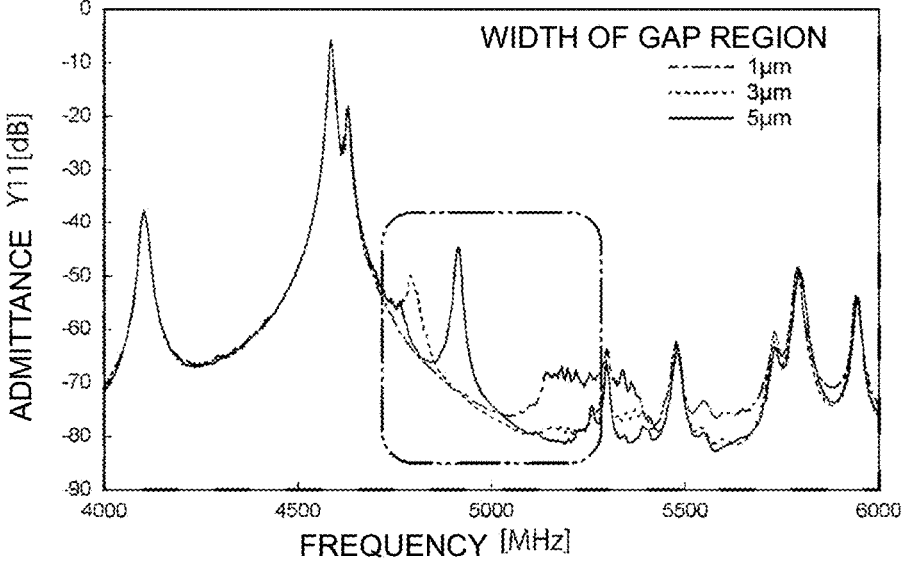
FIG. 6 is a diagram illustrating a relationship between the width of the gap region and an admittance frequency characteristic.

The piezoelectric layer; material . . . 157° rotated Y-cut LiNbO₃, thickness . . . about 0.36 μm The IDT electrode; layer configuration . . . Ti layer/AlCu layer/Ti layer from the piezoelectric layer side, thickness of each layer . . . about 0.01 μm/about 0.49 μm/about 0.004 μm from the piezoelectric layer side, wavelength λ . . . about 8.4 μm, duty ratio . . . about 0.21, width of gap region . . . about 1 μm, about 3 μm, or about 5 μm The protective film; material . . . SiO₂, thickness about 0.108 μm FIG. 5 is a diagram illustrating a relationship between the width of the gap region and the impedance frequency characteristic. FIG. 6 is a diagram illustrating a relationship between the width of the gap region and the admittance frequency characteristic.

In a case where the width of the gap region is about 3 μm or more as illustrated in FIGS. 5 and 6, the ripples due to unnecessary waves are generated between the resonant frequency and the anti-resonant frequency. On the other hand, in a case where the width of the gap region is about 1 μm, the ripples as described above are not generated. However, in a case where the width of the gap region is about 1 μm, the admittance and the insertion loss are increased in the band surrounded by a two-dot chain line in FIG. 6. As described above, in the first comparative example, it is not possible to reduce or prevent the unnecessary wave and to reduce or prevent the increase in the insertion loss, simultaneously.

On the other hand, in the first example embodiment illustrated in FIG. 1, a pair of mass addition films 24 are provided in each gap region. As a result, the unnecessary wave generated in the gap region can be reduced or prevented. By including the mass addition film 24, the unnecessary wave is reduced or prevented even in a case where the width of the gap region is enlarged. Therefore, it is possible to reduce or prevent the unnecessary wave and to reduce or prevent the increase in the insertion loss, simultaneously.

Furthermore, the thickness of the mass addition film that can effectively reduce or prevent the unnecessary wave is obtained according to size of the width of the gap region. More specifically, a plurality of acoustic wave devices having the configuration of the first example embodiment and having different widths of the gap regions or thicknesses of the mass addition films from each other were prepared. The admittance frequency characteristic of each of the prepared acoustic wave devices was measured. The design parameters of the acoustic wave device according to the measurement are as follows.

The piezoelectric layer; material . . . 157° rotated Y-cut LiNbO₃, thickness . . . about 0.4 μm The IDT electrode; layer configuration . . . Ti layer/AlCu layer/Ti layer from the piezoelectric layer side, thickness of each layer . . . about 0.01 μm/about 0.49 μm/about 0.004 μm from the piezoelectric layer side, wavelength λ . . . about 8.4 μm, duty ratio . . . about 0.21, width of gap region . . . about 3 μm, about 5 μm, or about 7 μm The mass addition film; material . . . Silicon Oxide The protective film; material . . . silicon oxide, thickness . . . about 0.108 μm In the plurality of acoustic wave devices, in a case where the width of the gap region is about 3 μm, the thickness of the mass addition film is about 10 nm, about 20 nm, about 30 nm, about 40 nm, about 50 nm, about 75 nm, about 100 nm, about 125 nm, or about 150 nm. In a case where the width of the gap region is about 5 μm, the thickness of the mass addition film is about 20 nm, about 30 nm, about 40 nm, about 50 nm, about 75 nm, about 100 nm, about 125 nm, or about 150 nm. In a case where the width of the gap region is about 7 μm, the thickness of the mass addition film is about 30 nm, about 40 nm, about 50 nm, about 75 nm, about 100 nm, about 125 nm, or about 150 nm.

Figure 7:
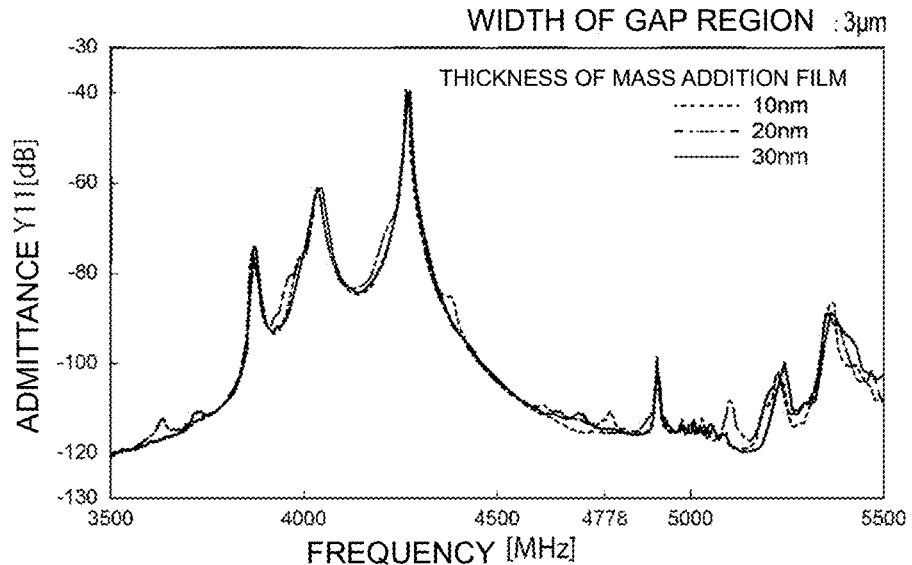
FIG. 7 is a diagram illustrating a relationship between a thickness of a mass addition film and the admittance frequency characteristic in a case where a width of the gap region is about 3 μm and a thickness of the mass addition film is about 10 nm to about 30 nm.
Figure 8:
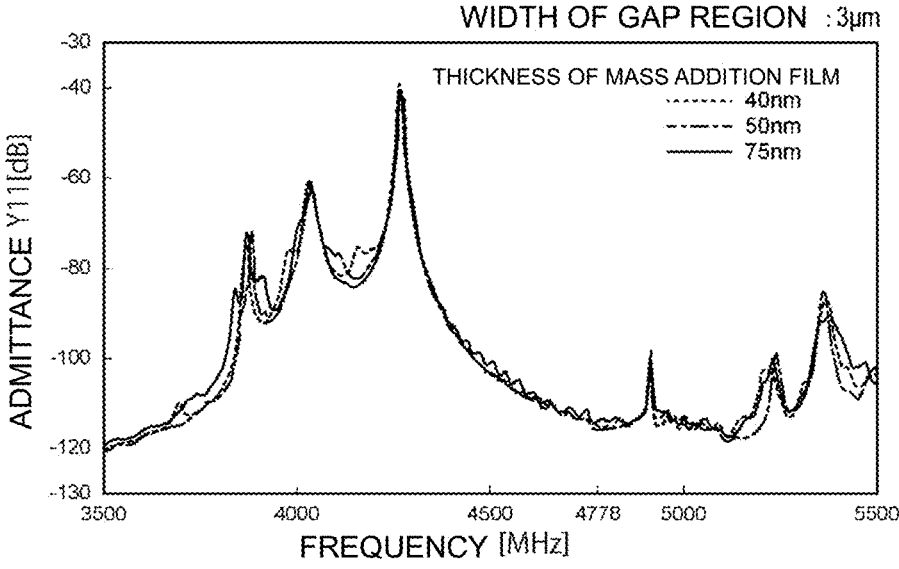
FIG. 8 is a diagram illustrating a relationship between the thickness of the mass addition film and the admittance frequency characteristic in a case where the width of the gap region is about 3 μm and the thickness of the mass addition film is about 40 nm to about 75 nm.
Figure 9:
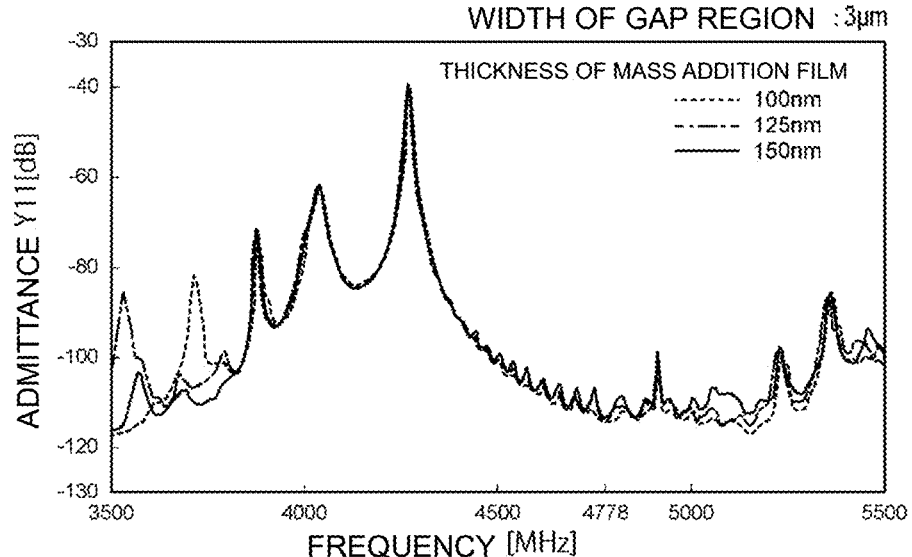
FIG. 9 is a diagram illustrating a relationship between the thickness of the mass addition film and the admittance frequency characteristic in a case where the width of the gap region is about 3 μm and the thickness of the mass addition film is about 100 nm to about 150 nm.

FIG. 7 is a diagram illustrating a relationship between the thickness of the mass addition film and the admittance frequency characteristic in a case where the width of the gap region is about 3 μm and the thickness of the mass addition film is about 10 nm to about 30 nm. FIG. 8 is a diagram illustrating a relationship between the thickness of the mass addition film and the admittance frequency characteristic in a case where the width of the gap region is about 3 μm and the thickness of the mass addition film is about 40 nm to about 75 nm. FIG. 9 is a diagram illustrating a relationship between the thickness of the mass addition film and the admittance frequency characteristic in a case where the width of the gap region is about 3 μm and the thickness of the mass addition film is about 100 nm to about 150 nm.

As illustrated in FIG. 7, in a case where the width of the gap region is about 3 μm and the thickness of the mass addition film is about 10 nm, ripples due to unnecessary waves were generated in the vicinity of 4400 MHz. However, the ripple is reduced or prevented, and the intensity of the ripple is small. On the other hand, in a case where the thickness of the mass addition film is about 20 nm or about 30 nm, ripples are not generated. As illustrated in FIGS. 8 and 9, even in a case where the thickness of the mass addition film is about 40 nm or more, ripples are not generated. Therefore, for example, in a case where the width of the gap region is about 3 μm, unnecessary waves can be more effectively reduced or prevented when the thickness of the mass addition film is about 20 nm or more.

Figure 10:
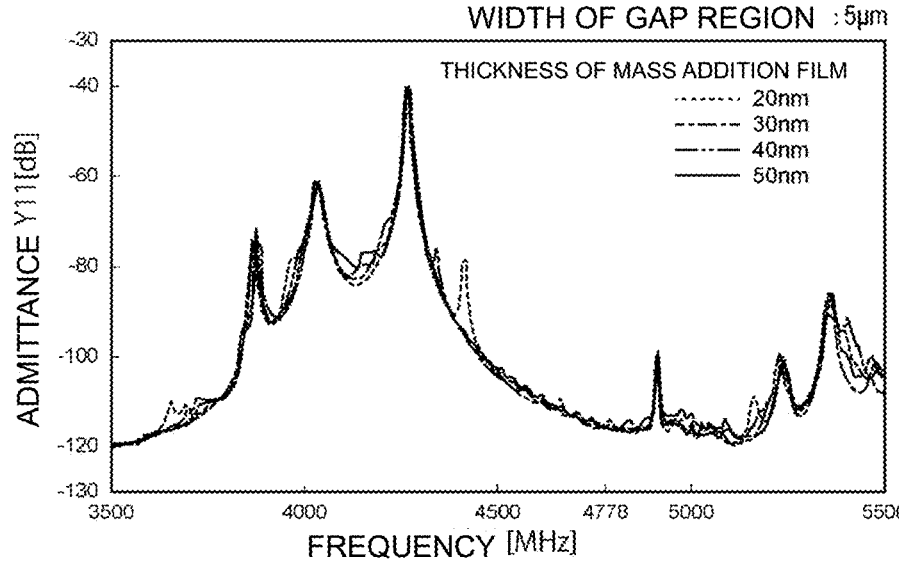
FIG. 10 is a diagram illustrating a relationship between the thickness of the mass addition film and the admittance frequency characteristic in a case where the width of the gap region is about 5 μm and the thickness of the mass addition film is about 20 nm to about 50 nm.
Figure 11:
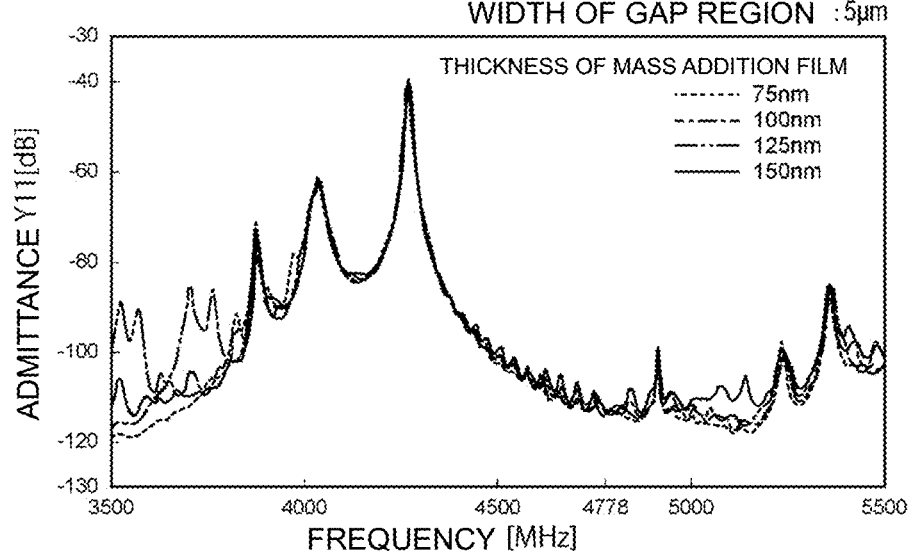
FIG. 11 is a diagram illustrating a relationship between the thickness of the mass addition film and the admittance frequency characteristic in a case where the width of the gap region is about 5 μm and the thickness of the mass addition film is about 75 nm to about 150 nm.

FIG. 10 is a diagram illustrating a relationship between the thickness of the mass addition film and the admittance frequency characteristic in a case where the width of the gap region is about 5 μm and the thickness of the mass addition film is 20 nm to about 50 nm. FIG. 11 is a diagram illustrating a relationship between the thickness of the mass addition film and the admittance frequency characteristic in a case where the width of the gap region is about 5 μm and the thickness of the mass addition film is about 75 nm to about 150 nm.

As illustrated in FIG. 10, in a case where the width of the gap region is about 5 μm and the thickness of the mass addition film is about 20 nm, ripples due to unnecessary waves were generated in the vicinity of 4400 MHz. However, the ripple is reduced, and the intensity of the ripple is small. On the other hand, in a case where the thickness of the mass addition film is about 30 nm, about 40 nm, or about 50 nm, the ripples are not substantially generated. As illustrated in FIG. 11, in a case where the thickness of the mass addition film is about 75 nm or more, the ripples are not generated. Therefore, for example, in a case where the width of the gap region is about 5 μm, unnecessary waves can be more effectively reduced or prevented when the thickness of the mass addition film is about 30 nm or more.

Figure 12:
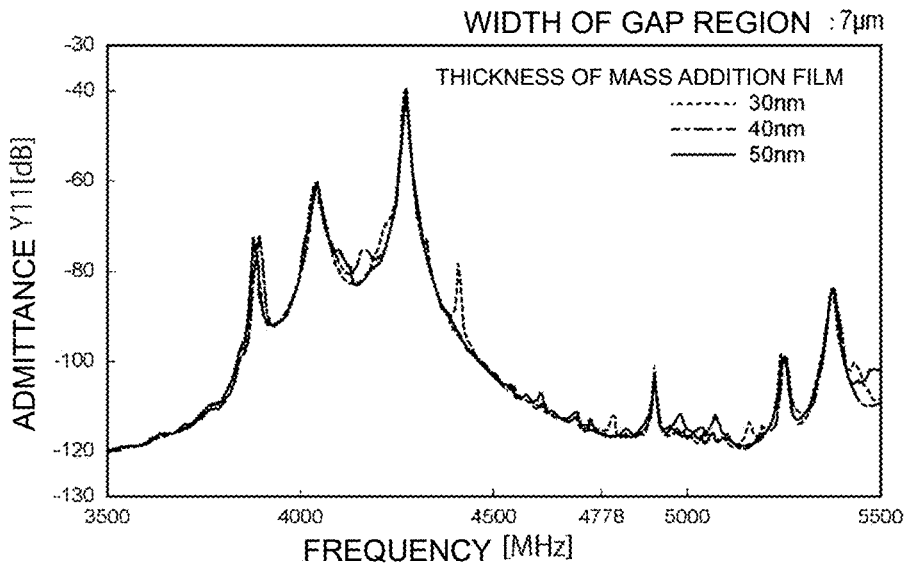
FIG. 12 is a diagram illustrating a relationship between the thickness of the mass addition film and the admittance frequency characteristic in a case where the width of the gap region is about 7 μm and the thickness of the mass addition film is about 30 nm to about 50 nm.
Figure 13:
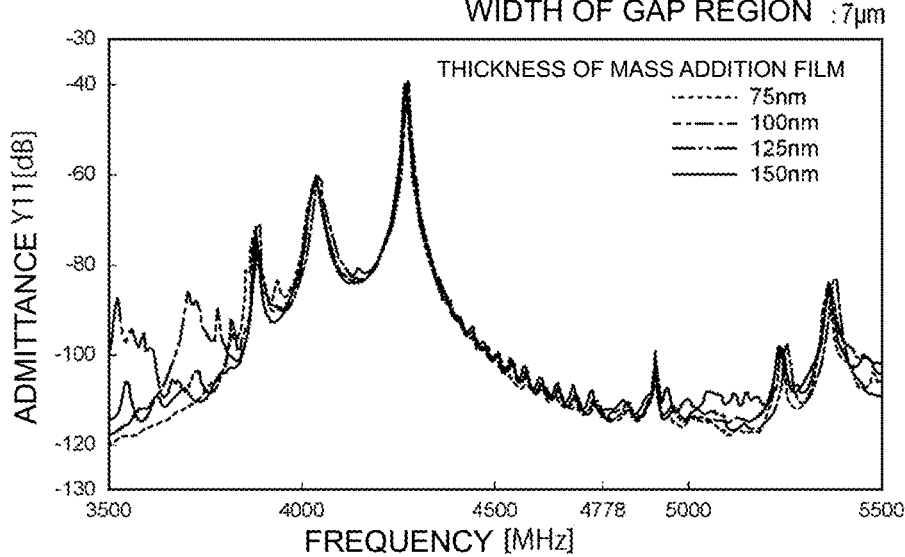
FIG. 13 is a diagram illustrating a relationship between the thickness of the mass addition film and the admittance frequency characteristic in a case where the width of the gap region is about 7 μm and the thickness of the mass addition film is about 75 nm to about 150 nm.

FIG. 12 is a diagram illustrating a relationship between the thickness of the mass addition film and the admittance frequency characteristic in a case where the width of the gap region is about 7 μm and the thickness of the mass addition film is about 30 nm to about 50 nm. FIG. 13 is a diagram illustrating a relationship between the thickness of the mass addition film and the admittance frequency characteristic in a case where the width of the gap region is about 7 μm and the thickness of the mass addition film is about 75 nm to about 150 nm.

As illustrated in FIG. 12, in a case where the width of the gap region is about 7 μm and the thickness of the mass addition film is 3 about 0 nm, ripples due to unnecessary waves generate in the vicinity of 4400 MHz. However, the ripple is reduced or prevented, and the intensity of the ripple is small. On the other hand, in a case where the thickness of the mass addition film is about 40 nm or about 50 nm, the ripples are not generated. As illustrated in FIG. 13, even in a case where the thickness of the mass addition film is about 75 nm or more, the ripples are not generated. Therefore, for example, in a case where the width of the gap region is about 7 μm, unnecessary waves can be more effectively suppressed when the thickness of the mass addition film is about 40 nm or more.

Figure 14:
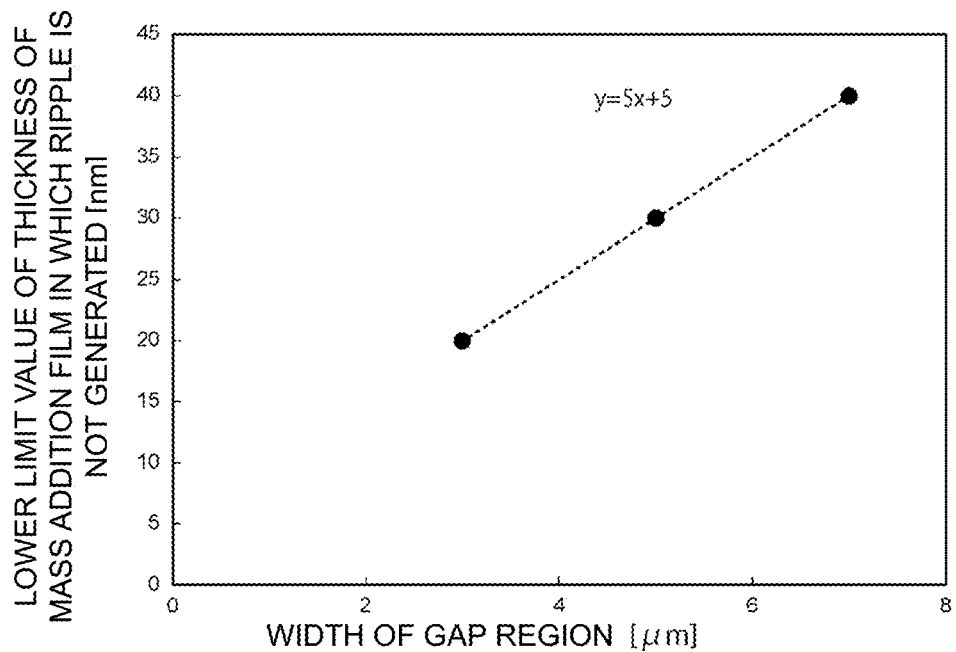
FIG. 14 is a diagram illustrating a relationship between the width of the gap region and a lower limit value of the thickness of the mass addition film when ripples due to unnecessary waves are not generated.

From the above results, the relationship between the width of the gap region and the lower limit value of the thickness of the mass addition film was obtained when the ripples due to unnecessary waves are not substantially generated in the admittance frequency characteristic. FIG. 14 is a diagram illustrating a relationship between the width of the gap region and the lower limit value of the thickness of the mass addition film when the ripples due to unnecessary waves are not substantially generated.

As illustrated in FIG. 14, it can be seen that the width of the gap region and the lower limit value of the thickness of the mass addition film are in a proportional relationship when the ripples due to unnecessary waves are not substantially generated. More specifically, when the width of the gap region is x [μm] and the thickness of the mass addition film is y [nm], the ripples are substantially not generated when a relationship of y=about 5x+5. Even in a case where the thickness of the mass addition film is larger than the lower limit value, the ripples are not generated. From this, it is preferable that y≥about 5x+5. As a result, unnecessary waves can be more effectively reduced or prevented.

Further, the magnitude of the insertion loss was evaluated in each acoustic wave device having the admittance frequency characteristics illustrated in FIGS. 7 to 13. Specifically, the admittance at about 4778 MHz of each acoustic wave device was compared. The smaller the admittance at about 4778 MHz, the smaller the insertion loss is.

Figure 15:
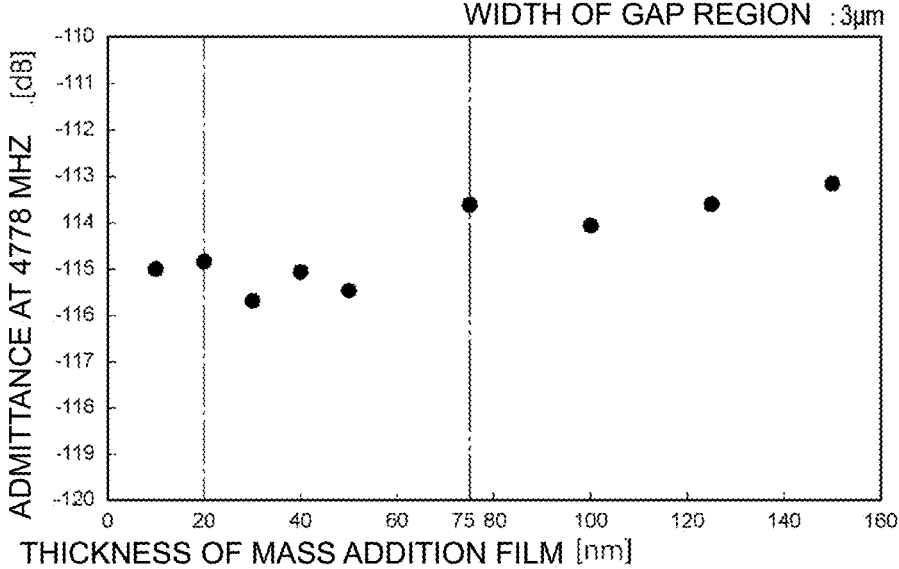
FIG. 15 is a diagram illustrating a relationship between the thickness of the mass addition film and the admittance at about 4778 MHz in a case where the width of the gap region is about 3 μm and the thickness of the mass addition film is about 10 nm to about 150 nm.
Figure 16:
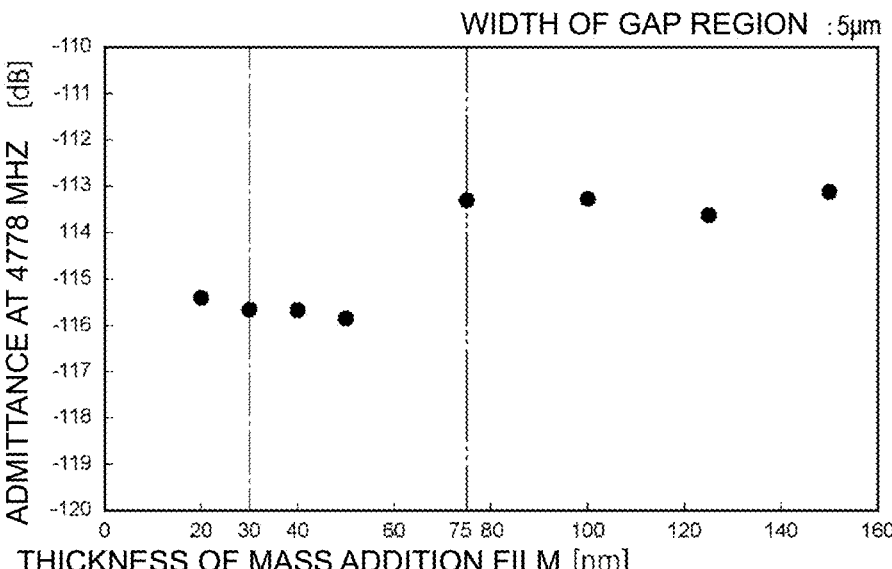
FIG. 16 is a diagram illustrating a relationship between the thickness of the mass addition film and the admittance at about 4778 MHz in a case where the width of the gap region is about 5 μm and the thickness of the mass addition film is about 20 nm to about 150 nm.
Figure 17:
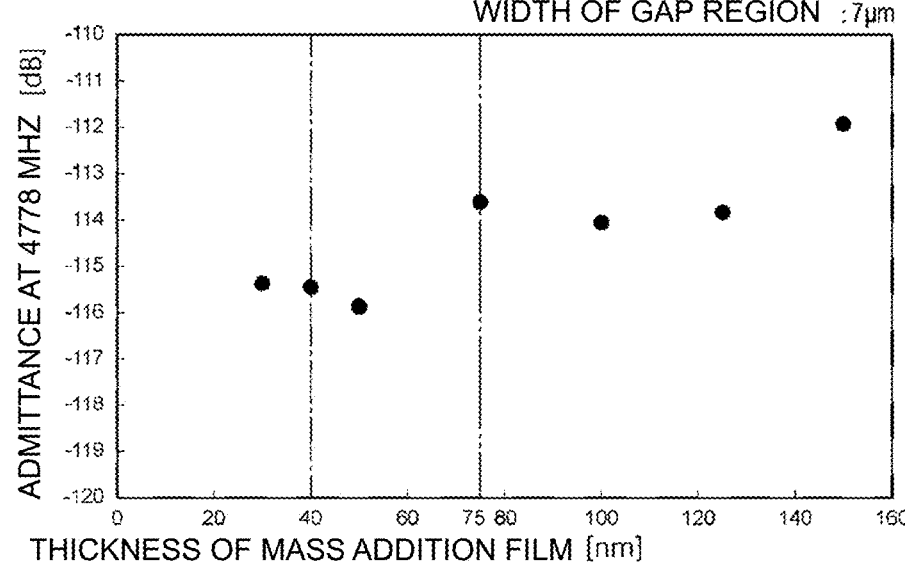
FIG. 17 is a diagram illustrating a relationship between the thickness of the mass addition film and the admittance at about 4778 MHz in a case where the width of the gap region is about 7 μm and the thickness of the mass addition film is about 30 nm to about 150 nm.

FIG. 15 is a diagram illustrating a relationship between the thickness of the mass addition film and the admittance at about 4778 MHz in a case where the width of the gap region is about 3 μm and the thickness of the mass addition film is about 10 nm to about 150 nm. FIG. 16 is a diagram illustrating a relationship between the thickness of the mass addition film and the admittance at about 4778 MHz in a case where the width of the gap region is about 5 μm and the thickness of the mass addition film is about 20 nm to about 150 nm. FIG. 17 is a diagram illustrating a relationship between the thickness of the mass addition film and the admittance at about 4778 MHz in a case where the width of the gap region is about 7 μm and the thickness of the mass addition film is about 30 nm to about 150 nm.

As illustrated in FIG. 15, in a case where the width of the gap region is about 3 μm, it can be seen that the admittance is small and the insertion loss is small when the thickness of the mass addition film is about 75 nm or less. Similarly, as illustrated in FIGS. 16 and 17, even in a case where the width of the gap region is about 5 μm or about 7 μm, it can be seen that the admittance is small and the insertion loss is small when the thickness of the mass addition film is about 75 nm or less.

In addition, by setting the thickness of the mass addition film to be equal to or larger than the thickness indicated by the one-dot chain lines in FIGS. 15, 16, and 17, unnecessary waves can be more effectively reduced or prevented. The relationship between the thickness of the mass addition film and the width of the gap region is as described by the above-described expression. From the above, for example, when the width of the gap region is x [μm] and the thickness of the mass addition film is y [nm], it is preferable that the thickness y of the mass addition film is 5x+5≤y≤75 nm. As a result, the unnecessary waves can be more effectively reduced or prevented, and the insertion loss can be reduced or prevented.

As described above, the generation of the unnecessary waves in the gap region is a problem specific to a case where the rotated Y-cut lithium niobate layer is used as the piezoelectric layer. This will be described below by comparing the first comparative example and a second comparative example. In the first comparative example, the rotated Y-cut lithium niobate layer is used as the piezoelectric layer. On the other hand, in the second comparative example, Z-cut lithium niobate is used as the piezoelectric layer. Similarly to the first comparative example, in the second comparative example, no mass addition film is provided. The acoustic wave device of the second comparative example also uses the bulk wave of the thickness shear mode.

The impedance frequency characteristic and the admittance frequency characteristic are compared in the acoustic wave devices of the first comparative example and the second comparative example. The design parameters of the acoustic wave device of the first comparative example according to the comparison are the same or substantially the same as the design parameters of the acoustic wave device having the width of the gap region of 5 μm in the acoustic wave devices having the frequency characteristics of FIGS. 5 and 6. The design parameters of the acoustic wave device of the second comparative example are as follows.

Figure 18:
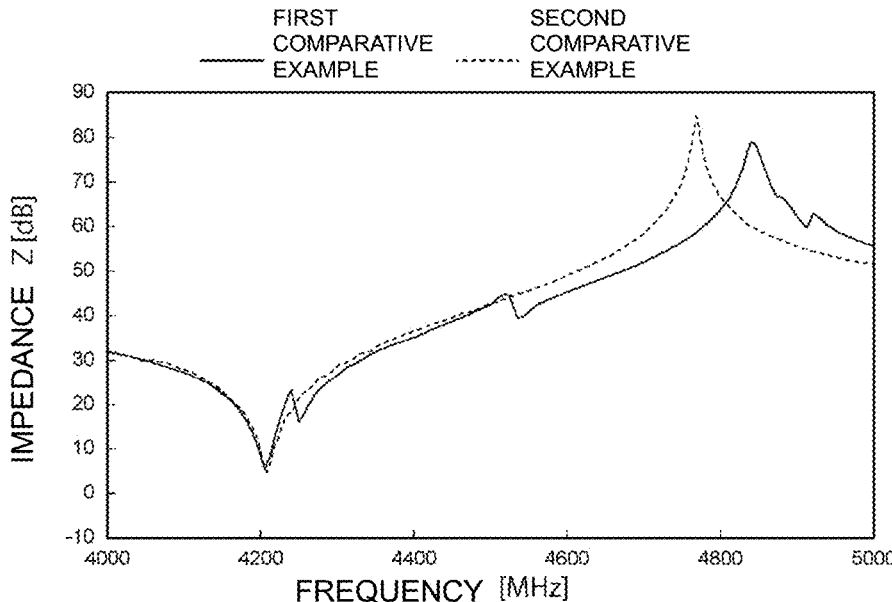
FIG. 18 is a diagram illustrating the impedance frequency characteristics in the first comparative example and a second comparative example.
Figure 19:
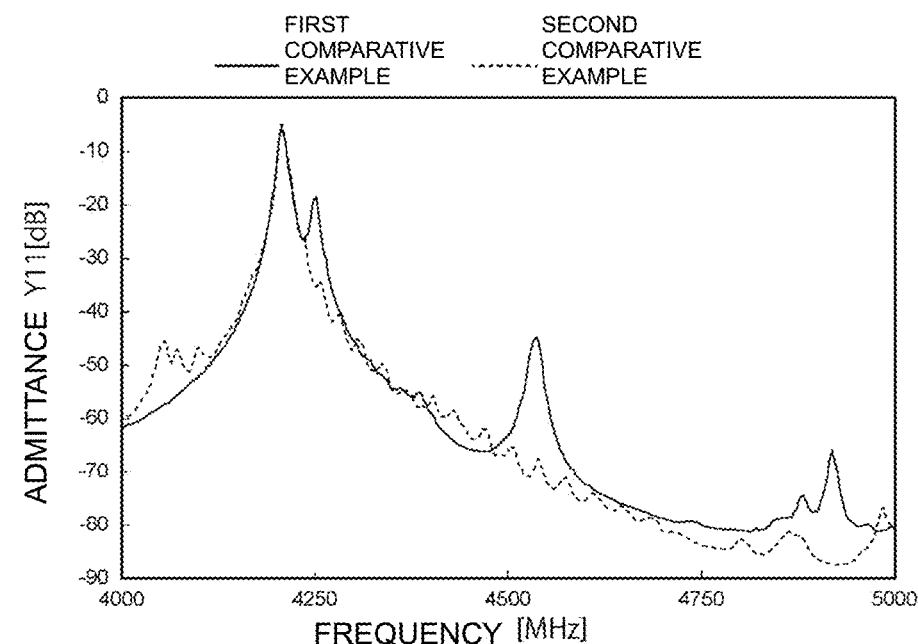
FIG. 19 is a diagram illustrating the admittance frequency characteristics in the first comparative example and the second comparative example.

The piezoelectric layer; material . . . Z-cut LiNbO₃, thickness . . . about 0.37 μm The IDT electrode; layer configuration . . . Ti layer/AlCu layer/Ti layer from the piezoelectric layer side, thickness of each layer . . . about 0.01 μm/about 0.49 μm/about 0.004 μm from the piezoelectric layer side, wavelength λ . . . about 8.4 μm, duty ratio . . . about 0.21, width of gap region . . . about 5 μm The protective Film; material . . . SiO₂, thickness . . . about 0.133 μm FIG. 18 is a diagram illustrating the impedance frequency characteristics in the first comparative example and the second comparative example. FIG. 19 is a diagram illustrating the admittance frequency characteristics in the first comparative example and the second comparative example.

As illustrated in FIGS. 18 and 19, in the first comparative example, large ripples are generated between the resonant frequency and the anti-resonant frequency. As described above, the ripples are due to unnecessary waves generated in the gap region. On the other hand, in the second comparative example, large ripples similar to those in the first comparative example are not generated. From the above, it can be confirmed that the generation of unnecessary waves in the gap region is a problem specific to a case where the rotated Y-cut lithium niobate layer is used as the piezoelectric layer.

Returning to FIG. 1, as in the first example embodiment, it is preferable that the mass addition film 24 is provided in both of the first gap region G1 and the second gap region G2, respectively. Accordingly, it is possible to reduce or prevent the generation of unnecessary waves in both the first gap region G1 and the second gap region G2. Therefore, the ripple generated in the admittance frequency characteristic or the like can be effectively reduced or prevented.

In the first example embodiment, the mass addition film 24 is continuously provided to overlap the plurality of electrode fingers and the region between the electrode fingers in plan view. More specifically, one of the pair of mass addition films 24 is provided over the entire or substantially the entire first gap region G1. The other of the pair of mass addition films 24 is provided over the entire or substantially the entire second gap region G2.

In a case where the mass addition film 24 is provided in the first gap region G1, the mass addition film 24 may be provided in at least a portion of the first gap region G1. More specifically, the mass addition film 24 may be provided in at least a portion of the first gap region G1 in the electrode finger extending direction. Further, the mass addition film 24 may be provided in at least a portion of the first gap region G1 in the electrode finger facing direction. The same applies in a case where the mass addition film 24 is provided in the second gap region G2.

The mass addition film 24 may overlap at least one electrode finger in plan view. However, it is preferable that the mass addition film 24 overlaps a plurality of electrode fingers in plan view, and it is more preferable that the mass addition film 24 overlaps all of the electrode fingers. As in the present example embodiment, it is more preferable that the mass addition film 24 is provided over the entire or substantially the entire gap region in the electrode finger facing direction. As a result, unnecessary waves generated in the gap region can be more reliably reduced or prevented.

As in the present example embodiment, the mass addition film 24 may be indirectly provided on the electrode finger or the first main surface 14a of the piezoelectric layer 14 with the protective film 23 interposed therebetween. Alternatively, the mass addition film 24 may be directly provided on the electrode finger or on the first main surface 14a of the piezoelectric layer 14.

It is preferable that the mass addition film 24 is a low acoustic velocity film. The low acoustic velocity film is a film having a relatively low acoustic velocity. More specifically, the acoustic velocity of the bulk wave propagating through the low acoustic velocity film is lower than an acoustic velocity of the bulk wave propagating through the piezoelectric layer 14. As the material of the mass addition film 24, for example, it is more preferable that at least one dielectric selected from silicon oxide, tungsten oxide, niobium pentoxide, tantalum oxide, and hafnium oxide is used. In this case, the acoustic velocity of the bulk wave propagating through the mass addition film 24 can be more reliably reduced. As a result, unnecessary waves generated in the gap region can be effectively reduced or prevented.

As described above, in the first example embodiment, both of the mass addition film 24 and the protective film 23 are provided in the first gap region G1 and the second gap region G2. Specifically, the mass addition film 24 and the protective film 23 are laminated. The mass addition film 24 and the protective film 23 are integrally made of the same material. In the first example embodiment, the thickness of the protective film 23 is uniform or substantially uniform. Therefore, the total thickness of the protective film 23 and the mass addition film 24 in the first gap region G1 and the second gap region G2 is larger than the thickness of the protective film 23 in the central region H.

In a case where the materials of the protective film 23 and the mass addition film 24 are the same, the thickness of the protective film 23 is the thickness of a portion of the protective film 23 provided on the electrode finger in the central region H. The thickness of the mass addition film 24 is obtained by subtracting the thickness of the protective film 23 from the total thickness of the protective film 23 and the mass addition film 24. It is preferable that the thickness of the mass addition film 24 is, for example, about 5 nm or more and about 100 nm or less. In this case, unnecessary waves generated in the gap region can be reduced or prevented, and the mass addition film 24 is easy to provide.

It is preferable that the width of the first gap region G1 and the second gap region G2 is, for example, about 1 μm or more and about 5 μm or less. In this case, unnecessary waves generated in the gap region can be reduced or prevented, and the IDT electrode 11 is easy to provide. It is more preferable that the width of the first gap region and the second gap region is, for example, about 3 μm or more and about 5 μm or less. In this case, unnecessary waves generated in the gap region can be reduced or prevented, the insertion loss can be reduced or prevented more reliably, and the IDT electrode 11 is easy to provide.

Figure 20:
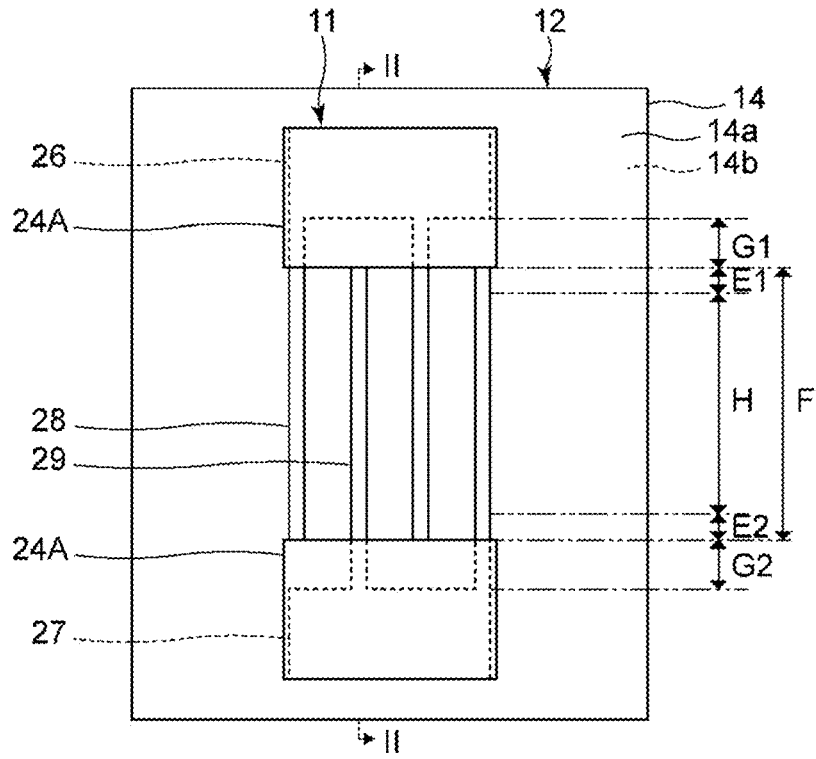
FIG. 20 is a schematic plan view of the acoustic wave device according to the first example embodiment of the present invention.
Figure 21:
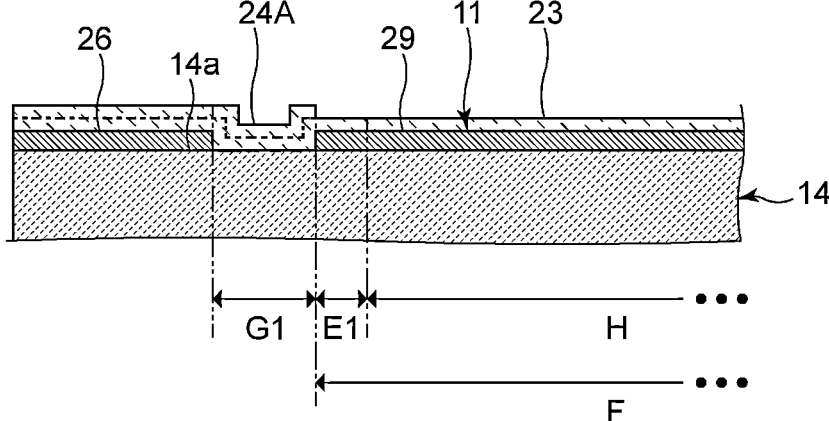
FIG. 21 is a schematic sectional view illustrating the vicinity of a first gap region along line II-II in FIG. 20.

In the first example embodiment, the mass addition film 24 is provided only in each gap region. However, the configuration is not limited thereto. For example, in a modified example of the first example embodiment illustrated in FIGS. 20 and 21, one of a pair of mass addition films 24A is provided over the first gap region G1 and the first busbar 26. The other of the pair of mass addition films 24A is provided over the second gap region G2 and the second busbar 27.

In the present modified example, similarly to each gap region, both the protective film 23 and the mass addition film 24A are also provided on the first busbar 26 and the second busbar 27. Specifically, the protective film 23 and the mass addition film 24A are laminated. Therefore, the total thickness of the protective film 23 and the mass addition film 24A in each gap region, on the first busbar 26, and on the second busbar 27 is larger than the thickness of the protective film 23 in the central region H. Similarly to the first example embodiment, in the present modified example, it is possible to reduce or prevent unnecessary waves and to reduce or prevent the increase in the insertion loss.

Figure 22:
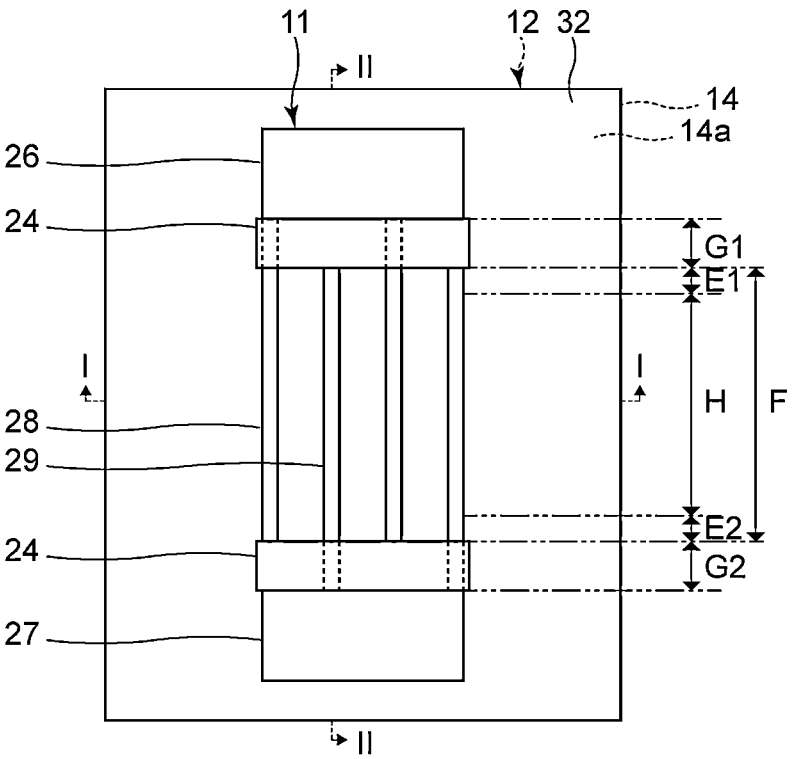
FIG. 22 is a schematic plan view of an acoustic wave device according to a second example embodiment of the present invention.
Figure 23:
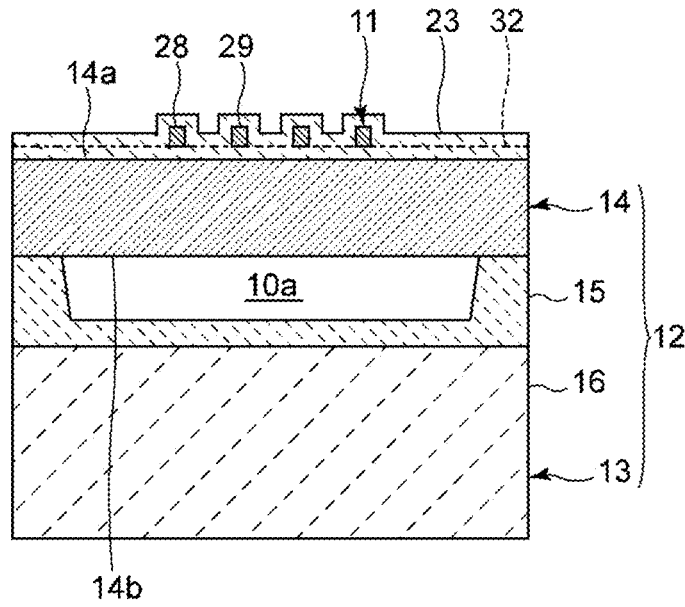
FIG. 23 is a schematic sectional view taken along line I-I in FIG. 22.
Figure 24:
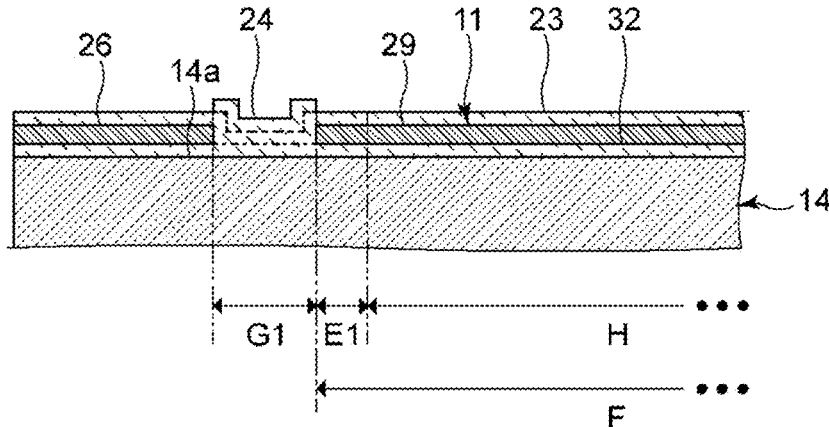
FIG. 24 is a schematic sectional view illustrating the vicinity of the first gap region along line II-II in FIG. 22.

FIG. 22 is a schematic plan view of an acoustic wave device according to a second example embodiment of the present invention. FIG. 23 is a schematic sectional view taken along line I-I in FIG. 22. FIG. 24 is a schematic sectional view illustrating the vicinity of the first gap region along line II-II in FIG. 22.

As illustrated in FIGS. 22 to 24, the present example embodiment is different from the first example embodiment in that a dielectric film 32 is provided between the IDT electrode 11 and the piezoelectric layer 14. In other respects, the acoustic wave device of the present example embodiment has the same or substantially the same configuration as the acoustic wave device 10 of the first example embodiment.

The dielectric film 32 overlaps the entire or substantially the entire IDT electrode 11 in plan view. The dielectric film 32 is also provided at the portion between the electrode fingers and in each of the gap regions on the first main surface 14a of the piezoelectric layer 14. However, the dielectric film 32 may be provided at least in the intersection region F. The dielectric film 32 is made of, for example, silicon oxide. The material of the dielectric film 32 is not limited to the above, and, for example, a dielectric such as silicon nitride can be used.

In the present example embodiment, the dielectric film 32, the mass addition film 24, and the protective film 23 are made of the same material. The one-dot chain line in FIG. 23 indicates a boundary between the dielectric film 32 and the protective film 23. Each one-dot chain line in FIG. 24 indicates the boundary between the dielectric film 32 and the protective film 23, and a boundary between the protective film 23 and the mass addition film 24.

As illustrated in FIG. 24, both of the mass addition film 24 and the dielectric film 32 are provided in the first gap region G1. Specifically, the dielectric film 32 and the mass addition film 24 are laminated. In the present example embodiment, the thickness of the dielectric film 32 is uniform or substantially uniform. Therefore, the total thickness of the dielectric film 32 and the mass addition film 24 in the first gap region G1 is larger than the thickness of the dielectric film 32 in the central region H.

Similarly to the first example embodiment, the protective film 23 is provided in the first gap region G1. In the first gap region G1, the dielectric film 32, the protective film 23, and the mass addition film 24 are laminated in this order. The total thickness of the dielectric film 32, the protective film 23, and the mass addition film 24 in the first gap region G1 is larger than the thickness of the dielectric film 32 in the central region H and larger than the thickness of the protective film 23 in the central region H. Further, the total thickness of the dielectric film 32, the protective film 23, and the mass addition film 24 in the first gap region G1 is larger than the total thickness of the dielectric film 32 and the protective film 23 in the central region H.

Similarly to the first gap region G1, in the second gap region G2, the dielectric film 32, the mass addition film 24, and the protective film 23 are laminated in this order. The thickness of each of the dielectric film 32, the protective film 23, and the mass addition film 24 in the second gap region G2 is equal or substantially equal to that of each of the dielectric film 32, the protective film 23, and the mass addition film 24 in the first gap region G1.

In the present example embodiment, the dielectric film 32, the protective film 23, and the mass addition film 24 are integrally made of the same material. As described above, in a case where the material of the dielectric film 32 is the same as the material of the mass addition film 24 or the protective film 23, the thickness of the dielectric film 32 is the thickness of the dielectric film 32 at a portion provided between the piezoelectric layer 14 and the IDT electrode 11 in the central region H. By adjusting the thickness of the dielectric film 32, the fractional bandwidth of the acoustic wave device can be easily adjusted.

Similarly to the first example embodiment, in the present example embodiment, the mass addition film 24 is provided in the first gap region G1 and the second gap region G2. Therefore, it is possible to reduce or prevent unnecessary waves and to reduce or prevent the increase in the insertion loss. This will be described below by comparing the present example embodiment and a third comparative example.

The third comparative example is different from the second example embodiment in that no mass addition film is provided. Similarly to the acoustic wave device of the second example embodiment, the acoustic wave device of the third comparative example uses the bulk wave of the thickness shear mode. The admittance frequency characteristics of the acoustic wave devices of the second example embodiment and the third comparative example were compared. In the comparison, the piezoelectric layer of the second example embodiment and the third comparative example was a 128° rotated Y-cut lithium niobate layer.

Figure 25:
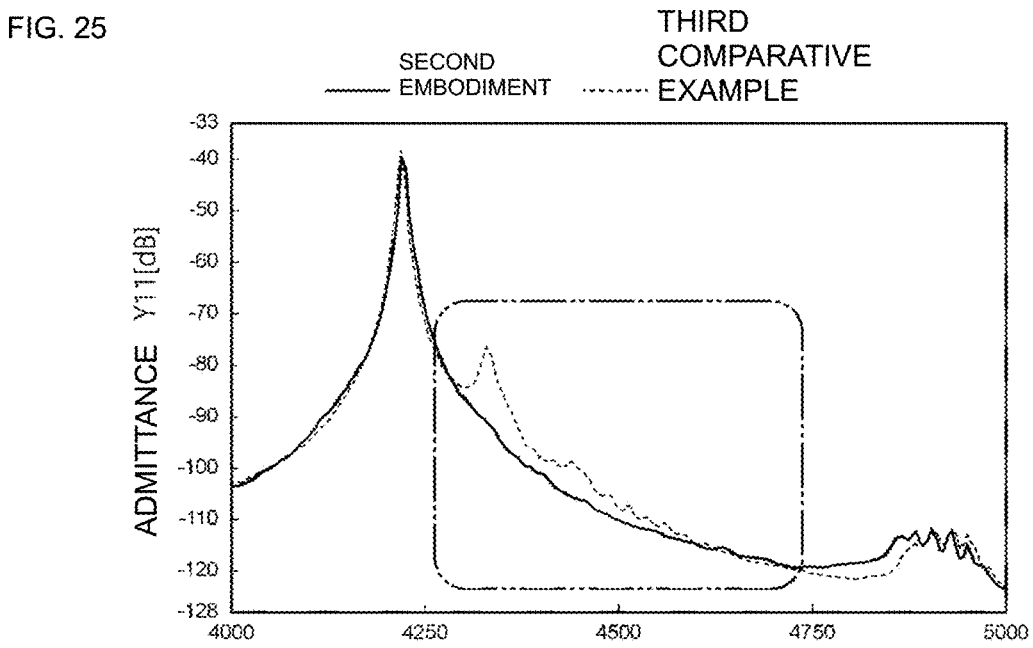
FIG. 25 is a diagram illustrating admittance frequency characteristics in the second example embodiment of the present invention and a third comparative example.

FIG. 25 is a diagram illustrating the admittance frequency characteristics in the second example embodiment of the present invention and the third comparative example.

As illustrated in FIG. 25, in the third comparative example, ripples are generated between the resonant frequency and the anti-resonant frequency. The ripple is due to unnecessary waves generated in the gap region. On the other hand, in the second example embodiment, the ripples that are generated in the third comparative example are reduced or prevented. From this, it can be seen that unnecessary waves can be reduced or prevented in the second example embodiment. Further, the admittance of the second example embodiment is equal to or less than the admittance of the third comparative example in the band surrounded by the two-dot chain line. Therefore, in the second example embodiment, it is possible to reduce or prevent the unnecessary wave and to reduce or prevent the increase in the insertion loss, simultaneously.

On the other hand, in the third comparative example, it is not possible to reduce or prevent the unnecessary wave and to reduce or prevent the increase in the insertion loss, simultaneously. The details thereof will be described below.

A plurality of acoustic wave devices of the third comparative example in which the widths of the gap regions are different from each other were prepared. In each acoustic wave device, the width of the first gap region and the width of the second gap region are the same or substantially the same. The impedance frequency characteristic and the admittance frequency characteristic of each of the prepared acoustic wave devices were measured. The design parameters of the acoustic wave device of the third comparative example are as follows.

Figure 26:
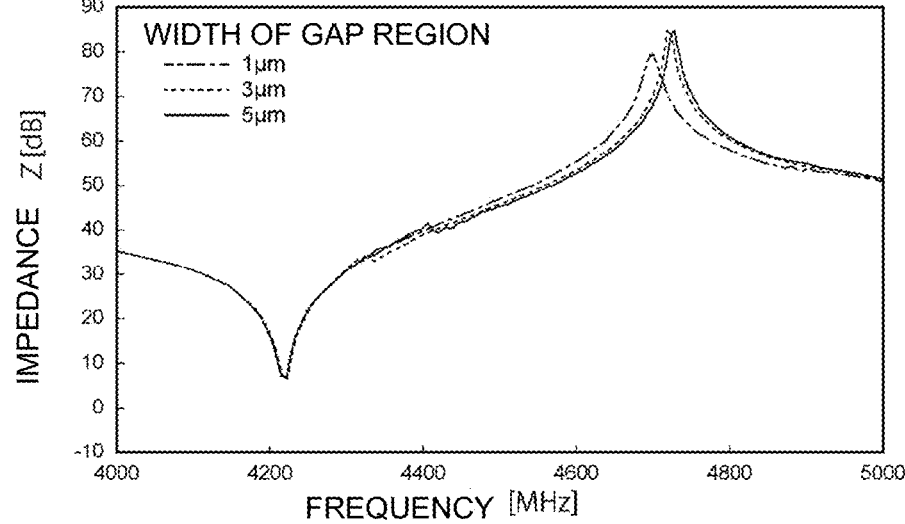
FIG. 26 is a diagram illustrating a relationship between the width of the gap region and the impedance frequency characteristic.
Figure 27:
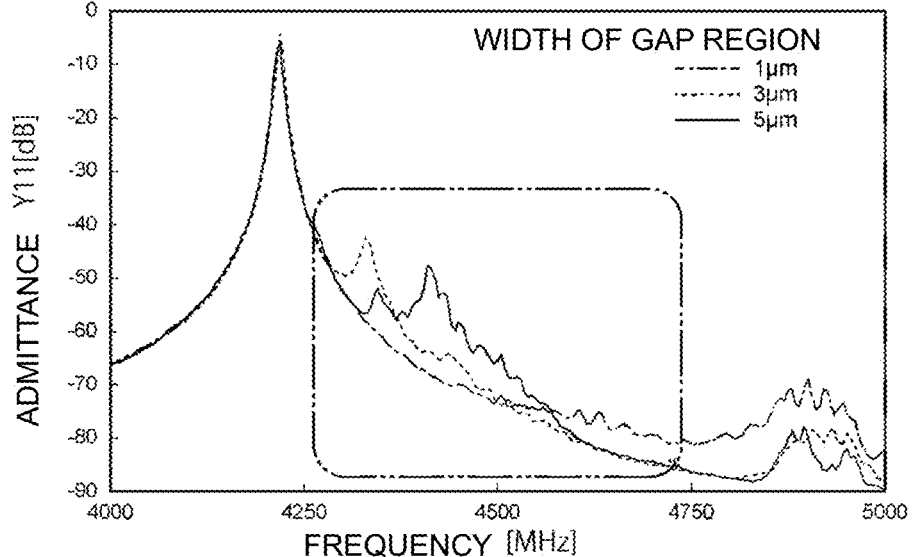
FIG. 27 is a diagram illustrating a relationship between the width of the gap region and the admittance frequency characteristic.

The piezoelectric layer; material . . . 128° rotated Y-cut LiNbO$_3$, thickness . . . about 0.36 μm The dielectric film 32; material . . . SiO$_2$, thickness . . . about 0.045 μm The IDT electrode; layer configuration . . . Ti layer/AlCu layer/Ti layer from the piezoelectric layer side, thickness of each layer . . . about 0.01 μm/about 0.49 μm/about 0.004 μm from the piezoelectric layer side, wavelength λ . . . about 8.4 μm, duty ratio . . . about 0.21, width of gap region . . . about 1 μm, about 3 μm, or about 5 μm The protective film; material . . . SiO$_2$, thickness . . . about 0.108 μm FIG. 26 is a diagram illustrating a relationship between the width of the gap region and the impedance frequency characteristic. FIG. 27 is a diagram illustrating a relationship between the width of the gap region and the admittance frequency characteristic.

In a case where the width of the gap region is about 3 μm or more as illustrated in FIGS. 26 and 27, ripples due to unnecessary waves are generated between the resonant frequency and the anti-resonant frequency. On the other hand, in a case where the width of the gap region is about 1 μm, the ripples as described above are not generated. However, in a case where the width of the gap region is about 1 μm, the admittance and the insertion loss are large in the band surrounded by the two-dot chain line in FIG. 27. As described above, in the third comparative example, it is not possible to reduce or prevent the unnecessary wave and to reduce or prevent the increase in the insertion loss, simultaneously.

On the other hand, in the second example embodiment illustrated in FIG. 22, a pair of mass addition films 24 are provided in each gap region. As a result, the unnecessary wave generated in the gap region can be reduced or prevented. By including the mass addition film 24, the unnecessary wave is reduced or prevented even in a case where the width of the gap region is enlarged. Therefore, it is possible to reduce or prevent the unnecessary wave and to reduce or prevent the increase in the insertion loss, simultaneously.

As described above, the generation of unnecessary waves in the gap region is a problem specific to a case where the rotated Y-cut lithium niobate layer is used as the piezoelectric layer. The same applies to a configuration in which the dielectric film 32 is provided. This will be confirmed below by comparing the second comparative example and the third comparative example. In the third comparative example, the rotated Y-cut lithium niobate layer is used as the piezoelectric layer. On the other hand, in the second comparative example, Z-cut lithium niobate is used as the piezoelectric layer. The second comparative example has the same or substantially the same configuration as that of the second comparative example compared with the first comparative example described above. In the second comparative example, the mass addition film and the dielectric film 32 are not provided. On the other hand, in the third comparative example, the mass addition film is not provided, and the dielectric film 32 is provided.

The impedance frequency characteristic and the admittance frequency characteristic were compared in the acoustic wave devices of the second comparative example and the third comparative example. The design parameters of the acoustic wave device of the third comparative example according to the comparison are the same or substantially the same as the design parameters of the acoustic wave device in which the width of the gap region is about 5 μm in the acoustic wave device having the frequency characteristics of FIGS. 26 and 27. The design parameters of the acoustic wave device of the second comparative example according to the comparison are the same or substantially the same as the design parameters of the acoustic wave device of the second comparative example having the frequency characteristics illustrated in FIGS. 18 and 19.

Figure 28:
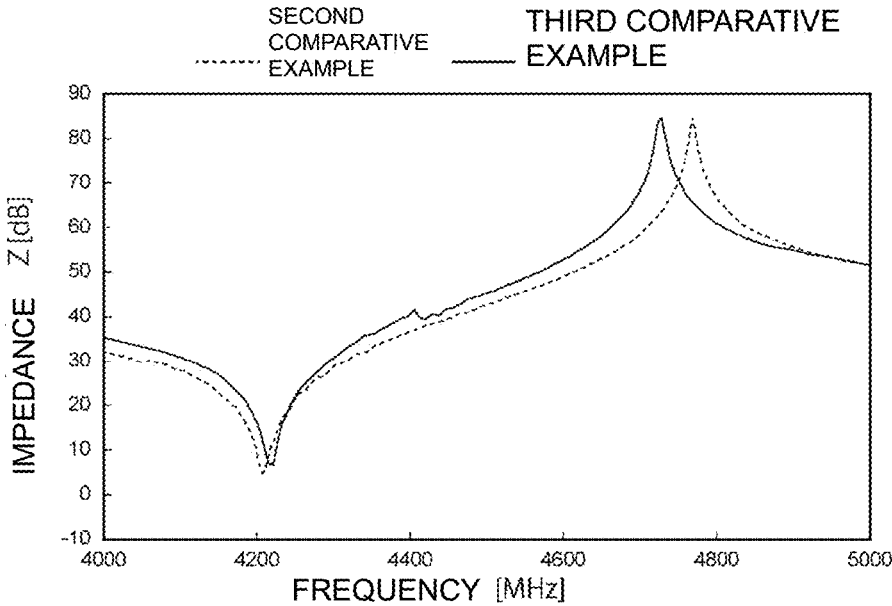
FIG. 28 is a diagram illustrating the impedance frequency characteristic in the second comparative example and the third comparative example.
Figure 29:
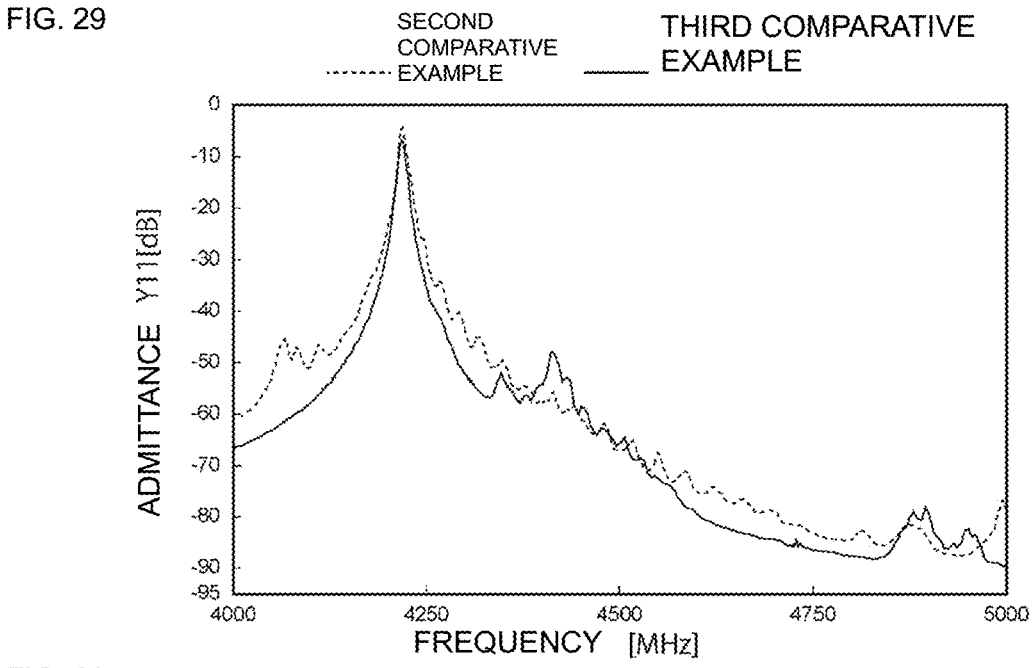
FIG. 29 is a diagram illustrating the admittance frequency characteristic in the second comparative example and the third comparative example.

FIG. 28 is a diagram illustrating the impedance frequency characteristics in the second comparative example and the third comparative example. FIG. 29 is a diagram illustrating the admittance frequency characteristics in the second comparative example and the third comparative example.

As illustrated in FIGS. 28 and 29, in the third comparative example, large ripples are generated between the resonant frequency and the anti-resonant frequency. As described above, the ripples are due to unnecessary waves generated in the gap region. On the other hand, in the second comparative example, large ripples similar to those in the third comparative example are not generated. From the above, it can be confirmed that the generation of unnecessary waves in the gap region is a problem specific to a case where the rotated Y-cut lithium niobate layer is used as the piezoelectric layer.

Figure 30:
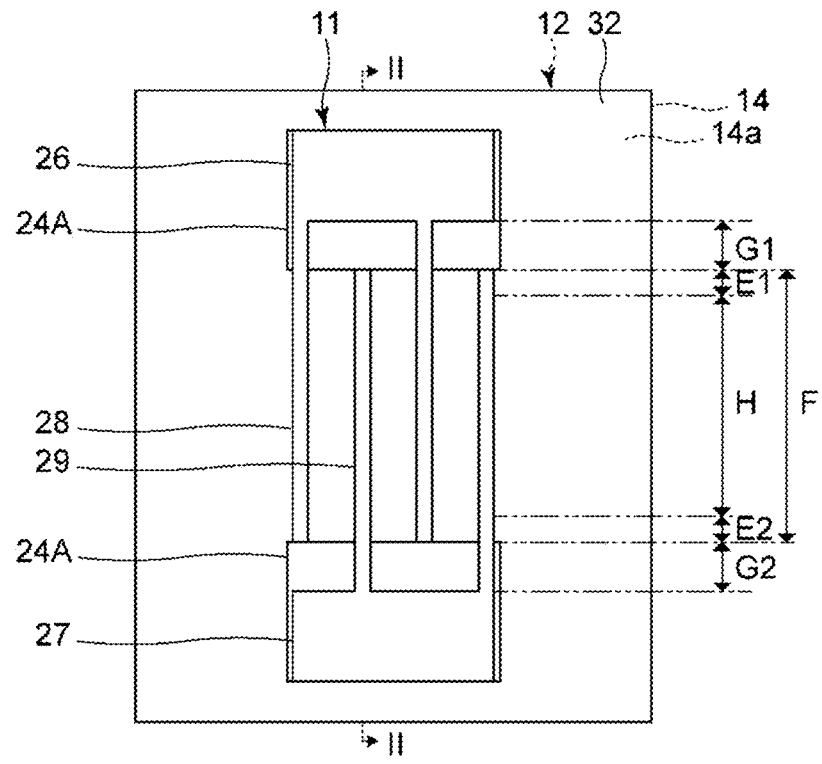
FIG. 30 is a schematic plan view of an acoustic wave device according to a third example embodiment of the present invention.
Figure 31:
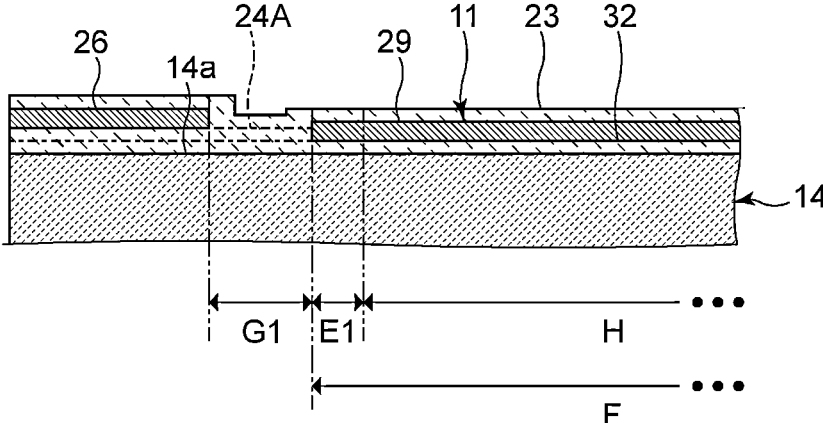
FIG. 31 is a schematic sectional view taken along line II-II in FIG. 30.

FIG. 30 is a schematic plan view of an acoustic wave device according to a third example embodiment of the present invention. FIG. 31 is a schematic sectional view taken along line II-II in FIG. 30.

As illustrated in FIGS. 30 and 31, the present example embodiment is different from the second example embodiment in that a pair of mass addition films 24A are provided between the IDT electrode 11 and the piezoelectric layer 14. As illustrated in FIG. 30, the present example embodiment is different from the second example embodiment in that one of the pair of mass addition films 24A overlaps the first busbar 26 in plan view. Further, the present example embodiment is different from the second example embodiment in that the other of the pair of mass addition films 24A overlaps the second busbar 27 in plan view. In other respects, the acoustic wave device of the present example embodiment has the same or substantially the same configuration as that of the acoustic wave device of the second example embodiment.

As illustrated in FIG. 31, in the first gap region G1, the piezoelectric layer 14, the dielectric film 32, the mass addition film 24A, and the protective film 23 are laminated in this order. Alternatively, in a portion where the electrode finger is provided in the first gap region G1, the piezoelectric layer 14, the dielectric film 32, the mass addition film 24A, the electrode finger, and the protective film 23 are laminated in this order. The same applies to the second gap region G2. The one of the pair of mass addition films 24A is provided between the dielectric film 32 and the first busbar 26 as illustrated in FIG. 31. The other of the pair of mass addition films 24A is provided between the dielectric film 32 and the second busbar 27.

Similarly to each gap region, the dielectric film 32 and the mass addition film 24A are laminated between the piezoelectric layer 14 and the first busbar 26. Therefore, the total thickness of the dielectric film 32 and the mass addition film 24A between the piezoelectric layer 14 and the first busbar 26 is larger than the thickness of the dielectric film 32 in the central region H. The dielectric film 32 and the mass addition film 24A are laminated also between the piezoelectric layer 14 and the second busbar 27. Therefore, the total thickness of the dielectric film 32 and the mass addition film 24A between the piezoelectric layer 14 and the second busbar 27 is larger than the thickness of the dielectric film 32 in the central region H.

In the present example embodiment, the mass addition film 24A is provided in each of the first gap region G1 and the second gap region G2. Therefore, similarly to the second example embodiment, it is possible to reduce or prevent unnecessary waves and to reduce or prevent the increase in the insertion loss.

In the first to third example embodiments, examples in which the mass addition film is not provided in the edge region are illustrated. However, the mass addition film may be provided in the edge region. The example is illustrated in a fourth example embodiment of the present invention. In the fourth example embodiment, the mass addition film provided in each gap region is defined as a first mass addition film.

Figure 32:
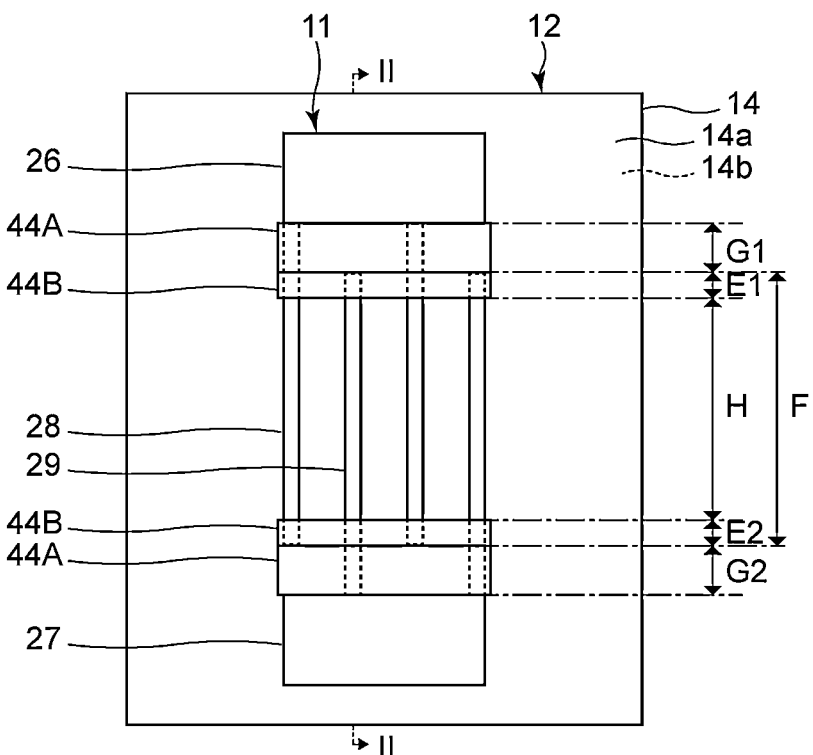
FIG. 32 is a schematic plan view of an acoustic wave device according to a fourth example embodiment of the present invention.
Figure 33:
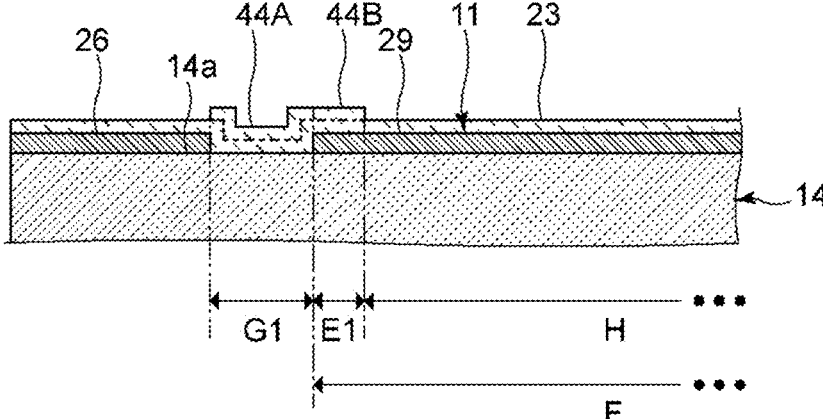
FIG. 33 is a schematic sectional view taken along line II-II in FIG. 32.

FIG. 32 is a schematic plan view of an acoustic wave device according to the fourth example embodiment. FIG. 33 is a schematic sectional view taken along line II-II in FIG. 32.

As illustrated in FIG. 32, in the present example embodiment, similarly to the first example embodiment, a first mass addition film 44A is provided in each of the first gap region G1 and the second gap region G2. The present example embodiment is different from the first example embodiment in that a second mass addition film 44B is provided in each of the first edge region E1 and the second edge region E2. In other respects, the acoustic wave device of the present example embodiment has the same or substantially the same configuration as the acoustic wave device 10 of the first example embodiment.

Each second mass addition film 44B has a belt shape. Each second mass addition film 44B is provided over each of the entire or substantially entire edge region. By providing the second mass addition film 44B, a low acoustic velocity region is provided in each edge region. The low acoustic velocity region is a region where the acoustic velocity is lower than the acoustic velocity in the central region H. In the electrode finger extending direction, the central region H and the low acoustic velocity region are disposed in this order from the inner side portion to the outer side portion of the IDT electrode 11. As a result, a piston mode is provided and a transverse mode can be reduced or prevented.

As described above, also in the present example embodiment, similarly to the first example embodiment, the first mass addition film 44A is provided in the first gap region G1 and the second gap region G2. Therefore, it is possible to reduce or prevent unnecessary waves and to reduce or prevent the increase in the insertion loss.

The acoustic wave device of the present example embodiment uses the bulk wave of the thickness shear mode rather than a surface acoustic wave. In this case, the piston mode can be provided even when the first mass addition film 44A is provided in each gap region. Accordingly, it is possible to obtain any of the advantageous effects of reducing or preventing the transverse mode, reducing or preventing unnecessary waves generated in the gap region, and reducing or preventing the increase in the insertion loss.

The second mass addition film 44B may be provided in at least one of the first edge region E1 and the second edge region E2. However, it is preferable that the second mass addition film 44B is provided in both of the first edge region E1 and the second edge region E2. As a result, the piston mode can be more reliably provided, and the transverse mode can be more reliably reduced or prevented.

The second mass addition film 44B may overlap at least one electrode finger in plan view. However, it is preferable that the second mass addition film 44B overlaps a plurality of electrode fingers in plan view, and it is more preferable that the second mass addition film 44B overlaps all of the electrode fingers. As a result, the piston mode can be more reliably provided, and the transverse mode can be more reliably reduced or prevented.

The second mass addition film 44B is made of, for example, silicon oxide. The material of the second mass addition film 44B is not limited to the above, and for example, at least one dielectric selected from the group consisting of silicon oxide, tungsten oxide, niobium pentoxide, tantalum oxide, and hafnium oxide can be used.

In FIG. 32, the first mass addition film 44A and the second mass addition film 44B are separately illustrated. However, as illustrated in FIG. 33, in the present example embodiment, the first mass addition film 44A, the second mass addition film 44B, and the protective film 23 are integrally made of the same material. The first mass addition film 44A, the second mass addition film 44B, and the protective film 23 may be made of materials different from each other.

As illustrated in FIG. 33, both of the second mass addition film 44B and the protective film 23 are provided in the first edge region E1. Specifically, the second mass addition film 44B and the protective film 23 are laminated. Similarly to the first example embodiment, the thickness of the protective film 23 is uniform or substantially uniform. Therefore, the total thickness of the protective film 23 and the second mass addition film 44B in the first edge region E1 is larger than the thickness of the protective film 23 in the central region H. The second mass addition film 44B and the protective film 23 are laminated in the second edge region E2 as well. The total thickness of the protective film 23 and the second mass addition film 44B in the second edge region E2 is larger than the thickness of the protective film 23 in the central region H.

In a case where the materials of the protective film 23 and the second mass addition film 44B are the same, the thickness of the second mass addition film 44B is obtained by subtracting the thickness of the protective film 23 from the total thickness of the protective film 23 and the second mass addition film 44B.

In the present example embodiment, the second mass addition film 44B is provided on the protective film 23. However, the second mass addition film 44B may be directly provided on the first main surface 14a of the piezoelectric layer 14 or the electrode finger. The protective film 23 may be provided on the second mass addition film 44B. Alternatively, the second mass addition film 44B may be provided between the piezoelectric layer 14 and the IDT electrode 11.

Acoustic wave devices according to example embodiments of the present invention can be used, for example, in filter devices. The example is illustrated in a fifth example embodiment of the present invention.

Figure 34:
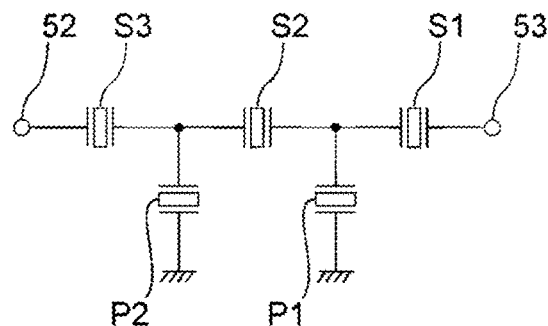
FIG. 34 is a circuit diagram of a filter device according to a fifth example embodiment of the present invention.

FIG. 34 is a circuit diagram of a filter device according to the fifth example embodiment.

A filter device 50 is, for example, a ladder filter. The filter device 50 includes a first signal terminal 52, a second signal terminal 53, a plurality of series arm resonators, and a plurality of parallel arm resonators. In the present example embodiment, all of the series arm resonators and all the parallel arm resonators are acoustic wave resonators. All of the series arm resonators and all of the parallel arm resonators are acoustic wave devices according to example embodiments of the present invention. However, at least one series arm resonator or at least one parallel arm resonator in the filter device 50 may be an acoustic wave device according to an example embodiment of the present invention.

The first signal terminal 52 and the second signal terminal 53 may be configured as, for example, an electrode pad or may be configured as wiring. In the present example embodiment, the first signal terminal 52 is an antenna terminal. The antenna terminal is connected to an antenna.

Specifically, the plurality of series arm resonators of the filter device 50 include a series arm resonator S1, a series arm resonator S2, and a series arm resonator S3. Specifically, the plurality of parallel arm resonators include a parallel arm resonator P1 and a parallel arm resonator P2.

Between the first signal terminal 52 and the second signal terminal 53, the series arm resonator S1, the series arm resonator S2, and the series arm resonator S3 are connected in series to each other. The parallel arm resonator P1 is connected between a connection point between the series arm resonator S1 and the series arm resonator S2, and a ground potential. The parallel arm resonator P2 is connected between a connection point between the series arm resonator S2 and the series arm resonator S3, and a ground potential. The circuit configuration of the filter device 50 is not limited to the above. The filter device 50 may include at least one series arm resonator and at least one parallel arm resonator.

The filter device 50 includes the series arm resonator and the parallel arm resonator which are acoustic wave devices according to example embodiments of the present invention. Therefore, similarly to the first example embodiment and the like, it is possible to reduce or prevent unnecessary waves and to reduce or prevent the increase in the insertion loss in the series arm resonator and the parallel arm resonator of the filter device 50.

In the filter device 50, it is preferable that the thickness of the mass addition film of at least one parallel arm resonator is smaller than the thickness of the mass addition film of at least one series arm resonator. It is more preferable that the thickness of the mass addition films in all of the parallel arm resonators is smaller than the thickness of the mass addition films in all the series arm resonators. As a result, as the filter device 50 as a whole, it is possible to effectively reduce or prevent unnecessary waves and to effectively reduce or prevent the increase in the insertion loss.

More specifically, in a case of having the above configuration, since the thickness of the mass addition film in the series arm resonator is large, unnecessary waves can be reduced or prevented in a band that has a large influence on the filter characteristics of the series arm resonator. On the other hand, the same band has a small influence on the filter characteristics of the parallel arm resonator. Therefore, in the parallel arm resonator, unnecessary waves may be generated in the same band. Therefore, in the parallel arm resonator, by reducing the thickness of the mass addition film, the insertion loss can be reduced or prevented in a band that has a large influence on the filter characteristics of the parallel arm resonator. The details of the advantageous effects will be more specifically described below.

The admittance frequency characteristics of the acoustic wave device used as the series arm resonator and the acoustic wave device used as the parallel arm resonator were measured. The design parameters of the series arm resonator are as follows.

The piezoelectric layer; material . . . 128° rotated Y-cut $LiNbO_3$, thickness . . . about 0.36 μm The dielectric film 32; material $SiO_2$, thickness about 0.045 μm The IDT electrode; layer configuration . . . Ti layer/AlCu layer/Ti layer from the piezoelectric layer side, thickness of each layer . . . about 0.01 μm/about 0.49 μm/about 0.004 μm from the piezoelectric layer side, wavelength λ . . . about 8.4 μm, duty ratio . . . about 0.21, width of gap region . . . about 5 μm The protective film; material . . . $SiO_2$, thickness . . . about 0.108 μm The mass addition film; thickness . . . about 0.055 μm The design parameters of the parallel arm resonator were the same or substantially the same as the design parameters of the series arm resonator, except that the thickness of the mass addition film was set to about 0.015 μm.

Figure 35:
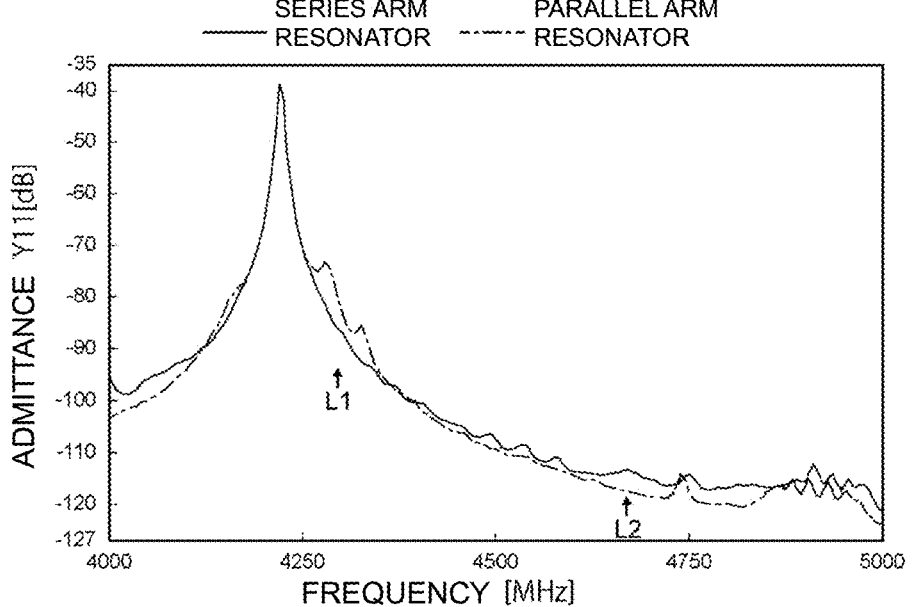
FIG. 35 is a diagram illustrating admittance frequency characteristics of a series arm resonator and a parallel arm resonator having different thicknesses of mass addition films.

FIG. 35 is a diagram illustrating admittance frequency characteristics of the series arm resonator and the parallel arm resonator having different thicknesses of mass addition films.

The band indicated by an arrow L1 in FIG. 35 is a band in which the series arm resonator has a large influence on the filter characteristics. It can be seen that unnecessary waves in the series arm resonator are reduced or prevented in the band indicated by the arrow L1. This is because the thickness of the mass addition film of the series arm resonator is large.

On the other hand, the band indicated by an arrow L2 in FIG. 35 is a band in which the parallel arm resonator has a large influence on the filter characteristics. It can be seen that the admittance of the parallel arm resonator is small and the insertion loss is small in the band indicated by the arrow L2. This is because the thickness of the mass addition film of the parallel arm resonator is thin.

Hereinafter, details of the thickness shear mode will be described. An "electrode" in the IDT electrode, which will be described later, corresponds to the electrode finger. The support in the following example corresponds to the support substrate.

Figures 36A, 36B:
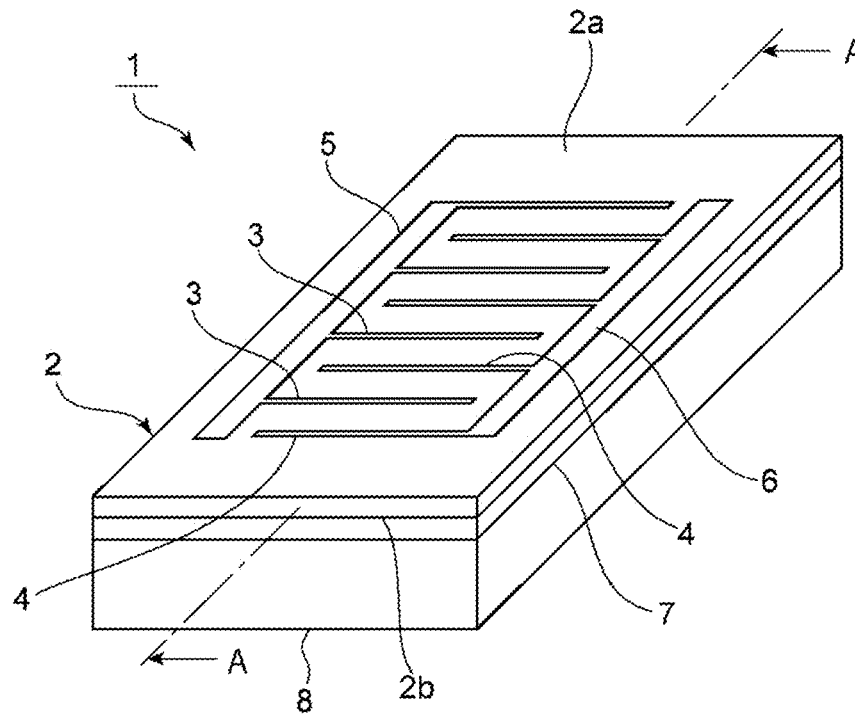
FIG. 36A is a schematic perspective view illustrating an appearance of an acoustic wave device that uses a bulk wave of a thickness shear mode.
FIG. 36B is a plan view illustrating an electrode structure on a piezoelectric layer.
Figure 37:
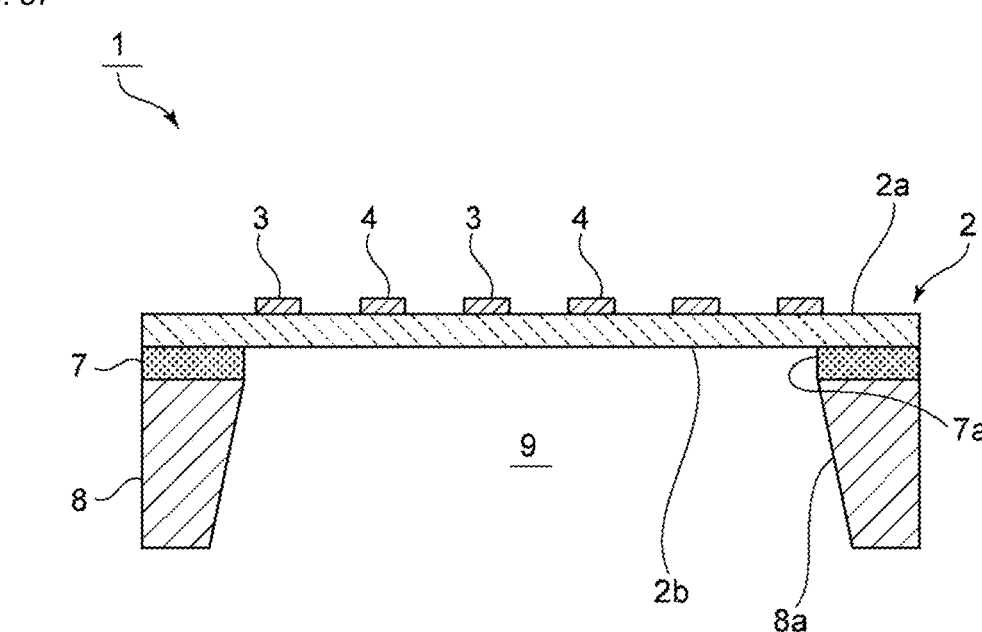
FIG. 37 is a sectional view of a portion taken along line A-A in FIG. 36A.

FIG. 36A is a schematic perspective view illustrating an appearance of the acoustic wave device that uses the bulk wave of the thickness shear mode, FIG. 36B is a plan view illustrating an electrode structure on the piezoelectric layer, and FIG. 37 is a sectional view of a portion taken along line A-A in FIG. 36A.

An acoustic wave device 1 includes a piezoelectric layer 2 made of LiNbO$_3$, for example. The piezoelectric layer 2 may be made of LiTaO$_3$, for example. Cut-angles of LiNbO$_3$ and LiTaO$_3$ are Z-cut, but may be rotated Y-cut or X-cut. The thickness of the piezoelectric layer 2 is not particularly limited, but to effectively excite a bulk wave of the thickness shear mode, it is preferable that the thickness is, for example, about 40 nm or more and about 1,000 nm or less, and it is more preferable that the thickness is about 50 nm or more and about 1,000 nm or less. The piezoelectric layer 2 includes first and second main surfaces 2a and 2b facing each other. Electrodes 3 and 4 are provided on the first main surface 2a. Here, the electrode 3 is an example of the "first electrode" and the electrode 4 is an example of the "second electrode". In FIGS. 36A and 36B, a plurality of electrodes 3 are a plurality of first electrode fingers connected to a first busbar 5. A plurality of electrodes 4 are a plurality of second electrode fingers connected to a second busbar 6. The plurality of electrodes 3 and the plurality of electrodes 4 are interdigitated with each other. Each of the electrodes 3 and 4 has a rectangular or substantially rectangular shape and a length direction. The electrode 3 and the adjacent electrode 4 face each other in a direction orthogonal or substantially orthogonal to the length direction. The length direction of the electrodes 3 and 4, and a direction orthogonal or substantially orthogonal to the length direction of the electrodes 3 and 4 are directions intersecting a thickness direction of the piezoelectric layer 2. Therefore, it can be said that the electrode 3 and the adjacent electrode 4 face each other in the direction intersecting the thickness direction of the piezoelectric layer 2. Moreover, the length direction of the electrodes 3 and 4 may be interchanged with the direction orthogonal to the length direction of the electrodes 3 and 4 illustrated in FIGS. 36A and 36B. That is, in FIGS. 36A and 36B, the electrodes 3 and 4 may extend in the direction in which the first busbar 5 and the second busbar 6 extend. In that case, the first busbar 5 and the second busbar 6 extend in the direction in which the electrodes 3 and 4 extend in FIGS. 36A and 36B. A plurality of pairs including the electrode 3 connected to one potential and the electrode 4 connected to the other potential are adjacent to each other are provided in the direction orthogonal or substantially orthogonal to the length direction of the electrodes 3 and 4. Here, when the electrodes 3 and 4 are adjacent to each other, it does not mean that the electrodes 3 and 4 are disposed so as to be in direct contact with each other, but that the electrodes 3 and 4 are disposed with a gap therebetween. In addition, in a case where the electrodes 3 and 4 are adjacent to each other, no electrode connected to a hot electrode or a ground electrode, including the other electrodes 3 and 4, is disposed between the electrodes 3 and 4. The number of pairs need not be integer pairs and may be 1.5 pairs, 2.5 pairs, or the like. It is preferable that a center-to-center distance, that is, a pitch between the electrodes 3 and 4 is, for example, in a range of about 1 μm or more and about 10 μm or less. It is preferable that the width of the electrodes 3 and 4, that is, the dimension of the electrodes 3 and 4 in the facing direction, is, for example, in the range of about 50 nm or more and about 1000 nm or less, and it is more preferable that the dimension is in the range of about 150 nm or more and about 1000 nm or less. The center-to-center distance between the electrodes 3 and 4 is a distance connecting the center of the dimension (width dimension) of the electrode 3 in the direction orthogonal or substantially orthogonal to the length direction of the electrode 3 and a center of the dimension (width dimension) of the electrode 4 in the direction orthogonal or substantially orthogonal to the length direction of the electrode 4.

In acoustic wave device 1, since the Z-cut piezoelectric layer is used, the direction orthogonal or substantially orthogonal to the length direction of the electrodes 3 and 4 is the direction orthogonal or substantially orthogonal to a polarization direction of the piezoelectric layer 2. This is not the case when a piezoelectric material with a different cut-angles is used as the piezoelectric layer 2. Here, "orthogonal" is not limited to being strictly orthogonal, but may be substantially orthogonal (an angle between the direction orthogonal to the length direction of the electrodes 3 and 4, and the polarization direction is, for example, about 90°±10°).

A support 8 is laminated on the second main surface 2b side of the piezoelectric layer 2 with an insulating layer 7 interposed therebetween. The insulating layer 7 and the support 8 have a frame shape and include through-hole 7a and 8a as illustrated in FIG. 37. A cavity portion 9 is thus provided. The cavity portion 9 is provided so as not to disturb the vibration of an excitation region C of the piezoelectric layer 2. Therefore, the support 8 is laminated on the second main surface 2b with the insulating layer 7 interposed therebetween at a position not overlapping the portion where at least one pair of electrodes 3 and 4 is provided. The insulating layer 7 does not necessarily need to be provided. Therefore, the support 8 can be directly or indirectly laminated to the second main surface 2b of the piezoelectric layer 2.

The insulating layer 7 is made of, for example, silicon oxide. However, in addition to silicon oxide, appropriate insulating materials such as, for example, silicon oxynitride and alumina can be used. The support 8 is made of, for example, Si. A plane orientation of the surface of Si on the piezoelectric layer 2 side may be (100), (110), or (111). It is preferable that Si of the support 8 has a high resistance with a resistivity of, for example, about 4 kΩcm or more. However, the support 8 can also be constructed using an appropriate insulating material or semiconductor material.

Examples of materials for the support 8 include piezoelectric materials such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrodes 3 and 4, and the first and second busbars 5 and 6 are made of appropriate metals or alloys such as, for example, Al and AlCu alloys. In the present example embodiment, the electrodes 3 and 4, and the first and second busbars 5 and 6 include an Al film laminated on a Ti film. An adhesion layer other than the Ti film may be used.

During driving, an AC voltage is applied between the plurality of electrodes 3 and the plurality of electrodes 4. More specifically, the AC voltage is applied between the first busbar 5 and the second busbar 6. As a result, it is possible to obtain resonance characteristics using the bulk wave of the thickness shear mode excited in the piezoelectric layer 2. In the acoustic wave device 1, when the thickness of the piezoelectric layer 2 is d and the center-to-center distance between adjacent electrodes 3 and 4 of any one of the plurality of pairs of electrodes 3 and 4 is p, d/p is, for example, about 0.5 or less. As a result, the bulk wave of the thickness shear mode is effectively excited, and good resonance characteristics can be obtained. More preferably, d/p is, for example, about 0.24 or less, in which case even better resonance characteristics can be obtained.

Since the acoustic wave device 1 has the above-described configuration, even if the number of pairs of the electrodes 3 and 4 is reduced in order to reduce the size, a Q value is unlikely to decrease. This is because the propagation loss is small even if the number of electrode fingers in reflectors on both sides is reduced. The reason why the number of electrode fingers can be reduced is that the bulk wave of the thickness shear mode is used. A difference between the Lamb wave used in the acoustic wave device and the bulk wave of the thickness shear mode will be described with reference to FIGS. 38A and 38B.

Figure 38A:
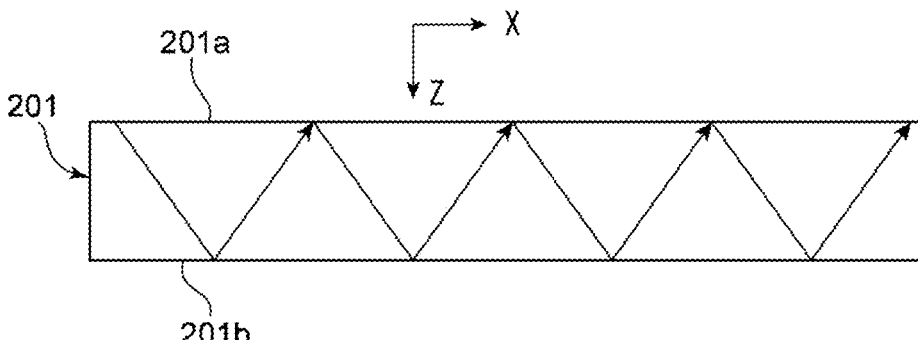
FIG. 38A is a schematic elevational sectional view for explaining a Lamb wave that propagates through a piezo-electric film of the acoustic wave device.

FIG. 38A is a schematic elevational sectional view for explaining a Lamb wave that propagates through a piezoelectric film of an acoustic wave device as described in Japanese Unexamined Patent Application Publication No. 2012-257019. Here, a wave propagates through a piezoelectric film 201 as indicated by arrows. Here, in the piezoelectric film 201, a first main surface 201a and a second main surface 201b face each other, and a thickness direction connecting the first main surface 201a and the second main surface 201b is a Z direction. An X direction is a direction in which electrode fingers of the IDT electrodes are arranged. As illustrated in FIG. 38A, in the Lamb wave, the wave propagates in the X direction as illustrated. Since it is a plate wave, although the piezoelectric film 201 as a whole vibrates, since the wave propagates in the X direction, the reflectors are provided on both sides to obtain resonance characteristics. Therefore, a wave propagation loss is generated, and the Q value decreases in a case where miniaturization is attempted, that is, in a case where the number of pairs of the electrode fingers is decreased.

Figure 38B:
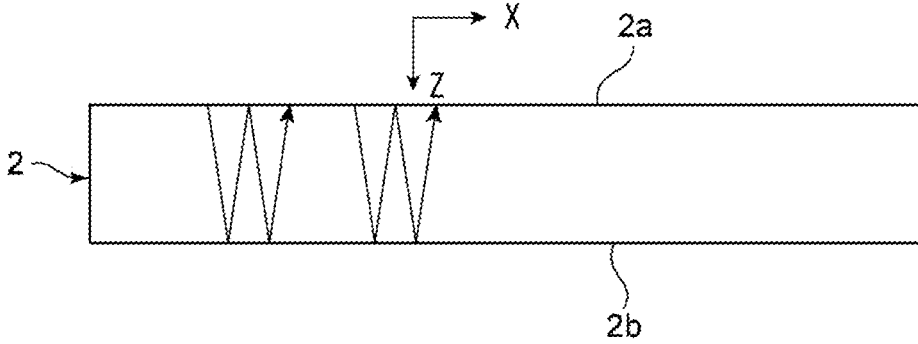
FIG. 38B is a schematic elevational sectional view for explaining a bulk wave of a thickness shear mode that propagates through the piezoelectric film in the acoustic wave device.

On the other hand, as illustrated in FIG. 38B, in the acoustic wave device 1, since a vibration displacement is in a thickness shear direction, the wave propagates and resonates substantially in the direction connecting the first main surface 2a and the second main surface 2b of the piezoelectric layer 2, that is, in the Z direction. That is, an X-direction component of the wave is significantly smaller than a Z-direction component. Since resonance characteristics are obtained by the propagation of waves in the Z direction, propagation loss is unlikely to be generated even if the number of electrode fingers of the reflector is reduced. Therefore, even if the number of electrode pairs including the electrodes 3 and 4 is reduced in an attempt to promote miniaturization, the Q value is unlikely to decrease.

Figure 39:
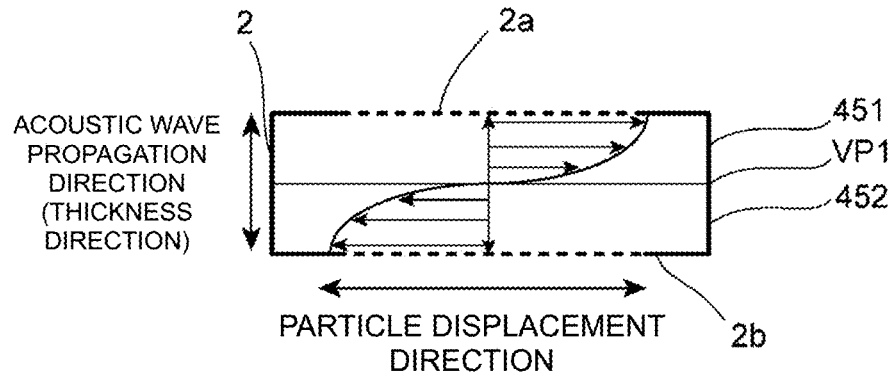
FIG. 39 is a diagram illustrating an amplitude direction of the bulk wave of the thickness shear mode.

Amplitude directions of the bulk wave of the thickness shear mode are opposite to each other between a first region 451 included in the excitation region C of the piezoelectric layer 2 and a second region 452 included in the excitation region C, as illustrated in FIG. 39. FIG. 39 schematically illustrates the bulk wave in a case where a voltage is applied between the electrodes 3 and 4 so that the potential of the electrode 4 is higher than that of the electrode 3. The first region 451 is a region of the excitation region C between a virtual plane VP1 that is orthogonal to the thickness direction of the piezoelectric layer 2 and bisects the piezoelectric layer 2, and the first main surface 2a. The second region 452 is a region of the excitation region C between the virtual plane VP1 and the second main surface 2b.

As described above, in the acoustic wave device 1, although at least one pair of electrodes including the electrodes 3 and 4 is provided, since waves are not propagated in the X direction, the number of electrode pairs including the electrodes 3 and 4 does not need to be plural. That is, it is sufficient that at least one pair of electrodes is provided.

For example, the electrode 3 is an electrode connected to a hot potential and the electrode 4 is an electrode connected to a ground potential. However, the electrode 3 may be connected to the ground potential and the electrode 4 may be connected to the hot potential. In the present example embodiment, at least one pair of electrodes is the electrode connected to the hot potential or the electrode connected to the ground potential, as described above, and no floating electrodes are provided.

Figure 40:
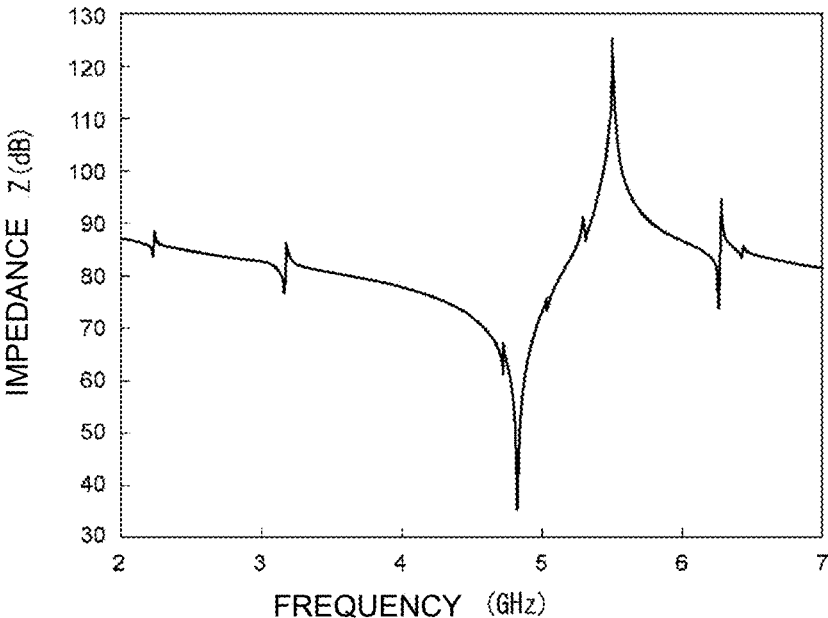
FIG. 40 is a diagram illustrating a resonance characteristic of the acoustic wave device using the bulk wave of the thickness shear mode.

FIG. 40 is a diagram illustrating the resonance characteristic of the acoustic wave device illustrated in FIG. 37. The design parameters of the acoustic wave device 1 with the resonance characteristic are as follows.

The piezoelectric layer 2: $LiNbO_3$ with Euler angles (0°, 0°, 90°), thickness=about 400 nm.

When viewed in a direction orthogonal or substantially orthogonal to the length direction of the electrodes 3 and 4, the length of the region where the electrodes 3 and 4 overlap, that is, the length of the excitation region C=about 40 μm, the number of pairs of electrodes including the electrodes 3 and 4=21 pairs, the center distance between the electrodes=about 3 μm, the width of the electrodes 3 and 4=about 500 nm, and d/p=about 0.133.

The insulating layer 7: silicon oxide film with a thickness of about 1 μm.

The support 8: Si.

The length of the excitation region C is the dimension along the length direction of the electrodes 3 and 4 of the excitation region C.

In the present example embodiment, inter-electrode distances of the electrode pairs including the electrodes 3 and 4 are all equal or substantially equal in the plurality of pairs. That is, the electrodes 3 and 4 were disposed at equal or substantially equal pitches.

As is clear from FIG. 40, good resonance characteristics with the fractional bandwidth of about 12.5% are obtained in spite of including no reflector.

In the way, when the thickness of the piezoelectric layer 2 is d and the center-to-center distance of the electrodes 3 and 4 is p, d/p is, for example, about 0.5 or less, and more preferably about 0.24 or less in the present example embodiment, as described above. This will be explained with reference to FIG. 41.

Figure 41:
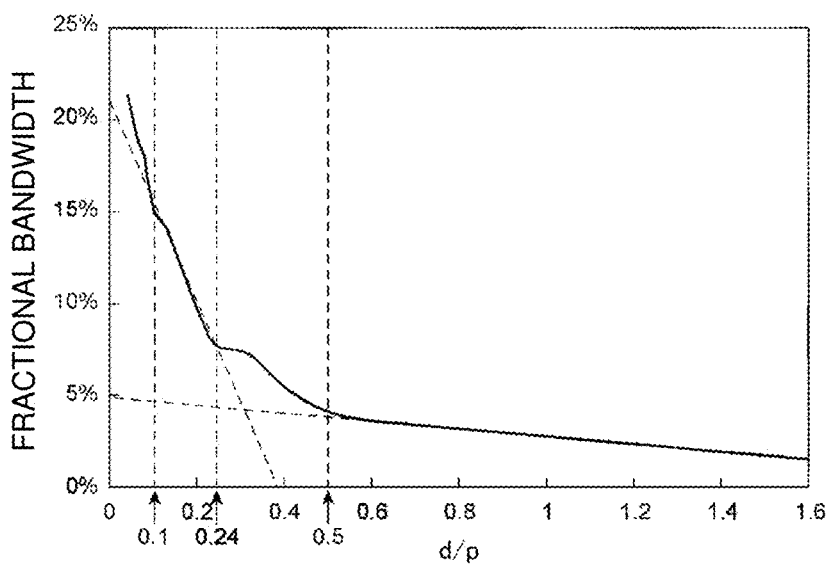
FIG. 41 is a diagram illustrating a relationship between d/p and a fractional bandwidth as a resonator in a case where p is a center-to-center distance of adjacent electrode fingers and d is the thickness of the piezoelectric layer.

A plurality of acoustic wave devices were obtained by changing d/p in the same or similar manner as the acoustic wave device that obtained the resonance characteristics illustrated in FIG. 40. FIG. 41 is a diagram illustrating a relationship between d/p and the fractional bandwidth as the resonator of the acoustic wave device.

As is clear from FIG. 41, if d/p>about 0.5, that is, even if d/p is adjusted, the fractional bandwidth is less than about 5%. On the other hand, if d/p about 0.5, when d/p is changed within that range, the fractional bandwidth can be about 5% or more, that is, a resonator having a high coupling coefficient can be constructed. If d/p is about 0.24 or less, the fractional bandwidth can be increased to about 7% or more. In addition, by adjusting d/p within this range, a resonator with a wider fractional bandwidth can be obtained, and a resonator with a higher coupling coefficient can be realized. Therefore, by setting d/p to, for example, about 0.5 or less, it can be seen that it is possible to configure a resonator having a high coupling coefficient using the bulk wave of the thickness shear mode.

Figure 42:
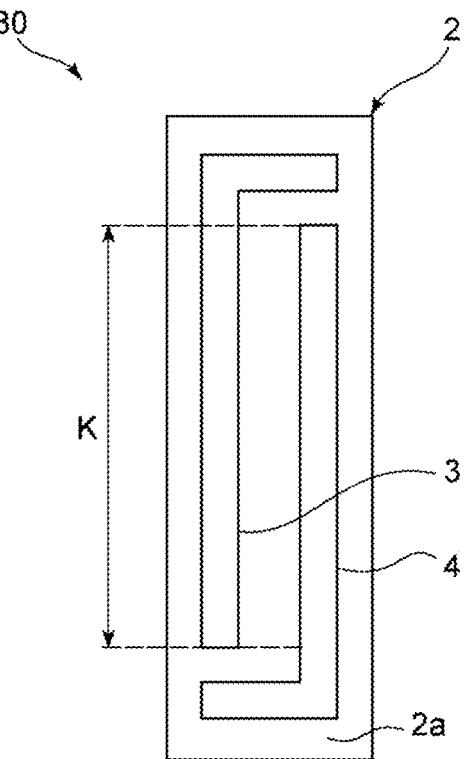
FIG. 42 is a plan view of the acoustic wave device using the bulk wave of the thickness shear mode.

FIG. 42 is a plan view of the acoustic wave device using the bulk wave of the thickness shear mode. In an acoustic wave device 80, a pair of electrodes including the electrode 3 and electrode 4 is provided on the first main surface 2a of the piezoelectric layer 2. K in FIG. 42 is an intersecting width. As described above, in acoustic wave device according to example embodiments of the present invention, the number of pairs of electrodes may be one. Even in this case, when the above d/p is about 0.5 or less, it is possible to effectively excite the bulk wave of the thickness shear mode.

Figure 43:
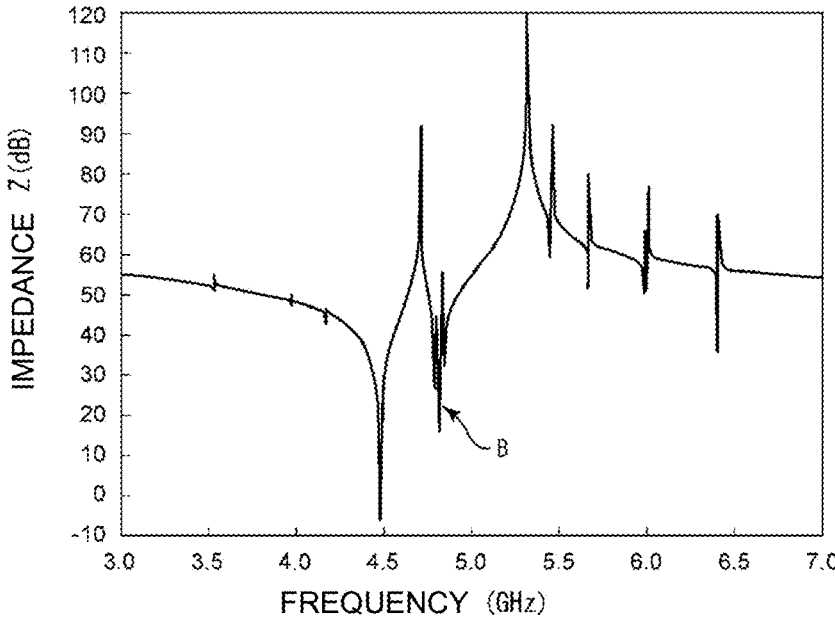
FIG. 43 is a diagram illustrating a resonance characteristic of an acoustic wave device of a reference example in which spurious response appears.

In the acoustic wave device 1, in the plurality of electrodes 3 and 4, it is preferable that the metallization ratio MR of the adjacent electrodes 3 and 4 with respect to the excitation region C, which is the region where any of the adjacent electrodes 3 and 4 overlap each other when viewed in the facing direction, satisfies MR≤about 1.75(d/p)+0.075. In that case, spurious responses can be effectively reduced. This will be described with reference to FIGS. 43 and 44. FIG. 43 is a reference diagram illustrating an example of the resonance characteristics of the acoustic wave device 1. A spurious response indicated by an arrow B appears between a resonant frequency and an anti-resonant frequency. Note that d/p=about 0.08 and the Euler angles of LiNbO$_3$ (0°, 0°, 90°). Also, the metallization ratio MR was set to about 0.35.

The metallization ratio MR will be explained with reference to FIG. 36B. In the electrode structure of FIG. 36B, when focusing on the pair of electrodes 3 and 4, it is assumed that only the pair of electrodes 3 and 4 is provided. In this case, a portion surrounded by a one-dot chain line is the excitation region C. When the electrodes 3 and 4 are viewed in the direction orthogonal or substantially orthogonal to the length direction of the electrodes 3 and 4, that is, in the facing direction, the excitation region C is a region where the electrode 3 overlaps the electrode 4, a region where the electrode 4 overlaps the electrode 3, and a region where the electrode 3 and the electrode 4 overlap each other in a region between the electrode 3 and the electrode 4. An area of the electrodes 3 and 4 in the excitation region C with respect to an area of this excitation region C is the metallization ratio MR. That is, the metallization ratio MR is a ratio of the area of the metallization portion with respect to the area of the excitation region C.

In a case where the plurality of pairs of electrodes are provided, the ratio of the metallization portion included in the entire excitation region to the total area of the excitation region may be MR.

Figure 44:
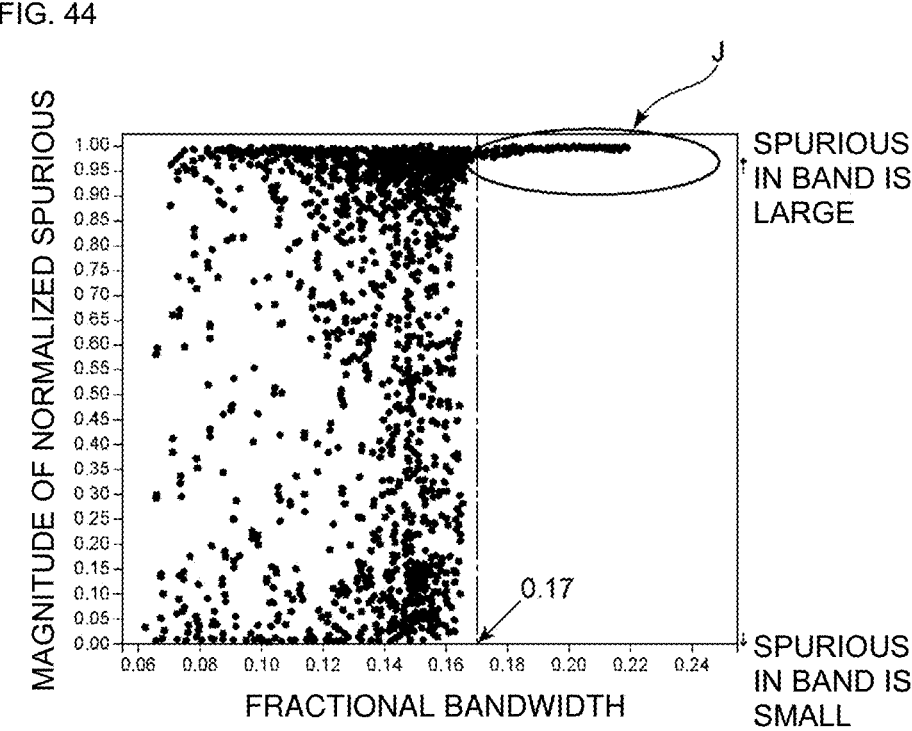
FIG. 44 is a diagram illustrating a relationship between the fractional bandwidth and a phase rotation amount of an impedance of the spurious response normalized by about 180 degrees as a magnitude of the spurious response.

FIG. 44 is a diagram illustrating a relationship between the fractional bandwidth and a phase rotation amount of an impedance of the spurious normalized by about 180 degrees as a magnitude of the spurious response in a case where a large number of acoustic wave resonators are configured according to the present example embodiment. The fractional bandwidth was adjusted by variously changing the film thickness of the piezoelectric layer and the dimensions of the electrodes. Moreover, FIG. 44 illustrates the results in a case where a Z-cut LiNbO$_3$ piezoelectric layer is used, but the same or similar tendency is obtained in a case where piezoelectric layers with other cut-angles are used.

In a region surrounded by an ellipse J in FIG. 44, the spurious response is as large as about 1.0. As is clear from FIG. 44, when the fractional bandwidth exceeds about 0.17, that is, exceeds about 17%, a large spurious response with a spurious level of about 1 or more appears in a pass band even when the parameters constituting the fractional bandwidth are changed. That is, as in the resonance characteristics illustrated in FIG. 43, a large spurious response indicated by the arrow B appears within the band. Therefore, it is preferable that the fractional bandwidth is, for example, about 17% or less. In this case, by adjusting the film thickness of the piezoelectric layer 2 and the dimensions of the electrodes 3 and 4, the spurious response can be reduced or prevented.

Figures 45, 46:
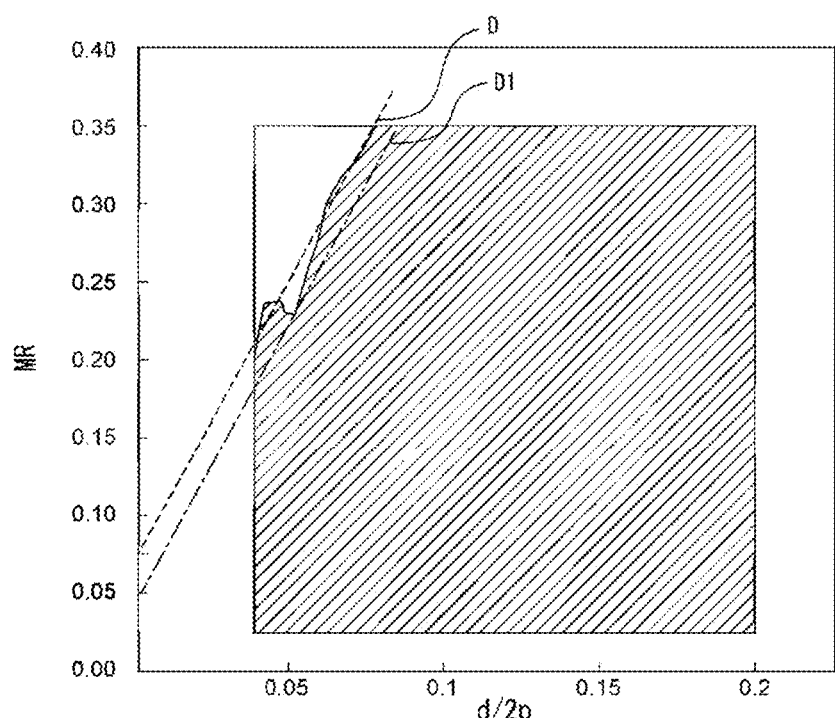
FIG. 45 is a diagram illustrating a relationship between d/2p and a metallization ratio MR.
FIG. 46 is a diagram illustrating a map of the fractional bandwidth with respect to Euler angles (0°, θ, φ) of LiNbO₃ in a case where d/p is infinitely close to 0.

FIG. 45 is a diagram illustrating a relationship between d/2p, the metallization ratio MR, and the fractional bandwidth. In the acoustic wave device described above, various acoustic wave devices having different d/2p and MR were constructed, and the fractional bandwidth was measured. A hatched portion on a right side of a broken line D in FIG. 45 is a region where the fractional bandwidth is about 17% or less. A boundary between the hatched region and the non-hatched region is expressed by MR=about 3.5(d/2p)+0.075. That is, MR=about 1.75(d/p)+0.075. Therefore, preferably, MR about 1.75(d/p)+0.075, for example. In that case, it is easy to set the fractional bandwidth to about 17% or less. More preferably, it is a region on a right side of MR=about 3.5(d/2p)+0.05 indicated by a one-dot chain line D1 in FIG. 45. That is, when MR about 1.75(d/p)+0.05, the fractional bandwidth can be reliably reduced to about 17% or less.

FIG. 46 is a diagram illustrating a map of the fractional bandwidth with respect to Euler angles (0°, θ, φ) of LiNbO$_3$ in a case where d/p is infinitely close to 0. A hatched portion in FIG. 46 is a region where the fractional bandwidth of at least 5% or more is obtained, and when the range of the region is approximated, it becomes the range expressed by the following Expressions (1), (2), and (3).

$$(0°\pm10°, 0° \text{ to } 20°, \text{any } \phi) \qquad \text{Expression (1)}$$

$$\begin{aligned}&(0°\pm10°, 20° \text{ to } 80°, 0° \text{ to } 60° \ (1-(\theta-50)^2/900)^{1/2}) \text{ or}\\&\quad(0°\pm10°, 20° \text{ to } 80°, [180°-60° \ (1-(\theta-50)^2/\\&\quad 900)^{1/2}] \text{ to } 180°)\end{aligned} \qquad \text{Expression (2)}$$

$$(0°\pm10°, [180°-30° \ (1-(\phi-90)^2/8100)^{1/2}] \text{ to }\\ \quad 180°, \text{any } \phi) \qquad \text{Expression (3)}$$

Therefore, in the case of the Euler angle range of Expression (1), Expression (2), or Expression (3), it is preferable because the fractional bandwidth can be sufficiently widened. The same applies to a case where the piezoelectric layer 2 is a lithium tantalate layer.

Figure 47:
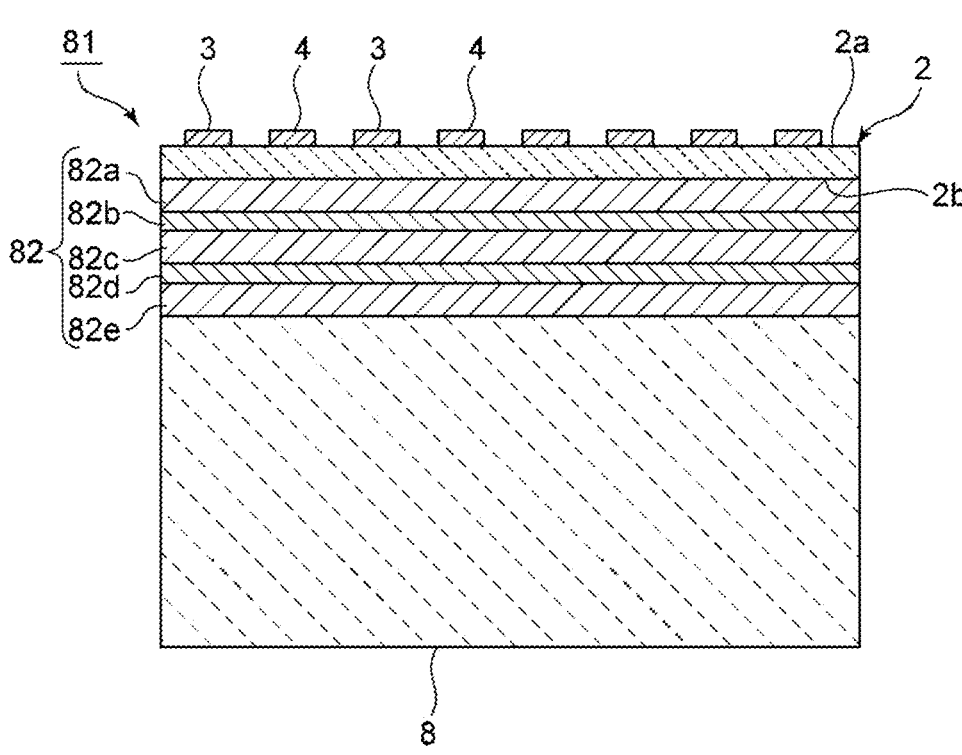
FIG. 47 is a front sectional view of an acoustic wave device including an acoustic multilayer film.

FIG. 47 is a front sectional view of an acoustic wave device having an acoustic multilayer film.

In an acoustic wave device 81, an acoustic multilayer film 82 is laminated on the second main surface 2b of the piezoelectric layer 2. The acoustic multilayer film 82 has a laminated including low acoustic impedance layers 82a, 82c, and 82e having relatively low acoustic impedance and high acoustic impedance layers 82b and 82d having relatively high acoustic impedance. In a case where the acoustic multilayer film 82 is used, the bulk wave of the thickness shear mode can be confined in the piezoelectric layer 2 without using the cavity portion 9 in the acoustic wave device 1. In the acoustic wave device 81, by setting d/p to about 0.5 or less, resonance characteristics based on the bulk wave of the thickness shear mode can be obtained. In the acoustic multilayer film 82, the number of laminated layers of the low acoustic impedance layers 82a, 82c, and 82e and the high acoustic impedance layers 82b and 82d is not particularly limited. At least one layer of the high acoustic impedance layers 82b and 82d may be disposed on the side farther from the piezoelectric layer 2 than the low acoustic impedance layers 82a, 82c, and 82e.

The low acoustic impedance layers 82a, 82c, and 82e and the high acoustic impedance layers 82b and 82d can be made of an appropriate material as long as the relationship between the acoustic impedances is satisfied. For example, as the material of the low acoustic impedance layers 82a, 82c, and 82e, silicon oxide, silicon oxynitride, or the like can be included. In addition, for example, as the material of the high acoustic impedance layers 82*b* and 82*d*, alumina, silicon nitride, metal, or the like can be included.

In the acoustic wave devices of the first to fourth example embodiments and each of the modified examples, for example, the acoustic multilayer film 82 illustrated in FIG. 47 may be provided between the support substrate and the piezoelectric layer. In this case, in the acoustic multilayer film 82, the low acoustic impedance layer and the high acoustic impedance layer may be alternately laminated. The acoustic multilayer film 82 may be the acoustic reflection portion in the acoustic wave device.

In the acoustic wave devices of the first to fourth example embodiments and each of the modified examples using the bulk wave of the thickness shear mode, as described above, for example, it is preferable that d/p is about 0.5 or less, and it is more preferable that d/p is about 0.24 or less. As a result, even better resonance characteristics can be obtained. Further, as described above, in the intersection region in the acoustic wave devices of the first to fourth example embodiments and each of the modified examples using the bulk wave of the thickness shear mode, it is preferable that, for example, MR≤about 1.75(d/p)+0.075 is satisfied. In this case, the spurious response can be more reliably reduced or prevented.

It is preferable that the piezoelectric layer in the acoustic wave devices of the first to fourth example embodiments and each of the modified examples using the bulk wave of the thickness shear mode is, for example, a lithium niobate layer or a lithium tantalate layer. It is preferable that Euler angles (φ, θ, φ) of lithium niobate or lithium tantalate of the piezoelectric layer are in the range of Expression (1), Expression (2), or Expression (3). In this case, the fractional bandwidth can be sufficiently widened.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support including a support substrate;

a piezoelectric layer on the support and being a rotated Y-cut lithium niobate layer;

an IDT electrode on the piezoelectric layer and including a pair of busbars and a plurality of electrode fingers; and a protective film on the piezoelectric layer and covering the IDT electrode; wherein the support includes an acoustic reflection portion overlapping at least a portion of the IDT electrode in plan view;

d/p is about 0.5 or less, when a thickness of the piezoelectric layer is d and a center-to-center distance of adjacent electrode fingers is p;

at least one of the plurality of electrode fingers are connected to one of the pair of busbars of the IDT electrode, others of the plurality of electrode fingers are connected to another of the pair of busbars, and the at least one of the plurality of electrode fingers connected to the one of the pair of busbars and the others of the plurality of electrode fingers connected to the another of the pair of busbars are interdigitated with each other;

when viewed from a direction in which adjacent electrode fingers of the plurality of electrode fingers face each other, a region where the adjacent electrode fingers overlap each other is an intersection region and a region which is located between the intersection region and the pair of busbars is a pair of gap regions;

a mass addition film is provided in at least a portion of at least one of the pair of gap regions;

when an extending direction of the plurality of electrode fingers is defined as an electrode finger extending direction, the intersection region includes a central region and a pair of edge regions sandwiching the central region in the electrode finger extending direction; and both of the protective film and the mass addition film are provided in each of the pair of gap regions, and a total thickness of the protective film and the mass addition film in the pair gap regions is larger than a thickness of the protective film in the central region.

2. The acoustic wave device according to claim 1, wherein the mass addition film is provided in each of the pair of gap regions.

3. The acoustic wave device according to claim 1, wherein the mass addition film is a low acoustic velocity film, and an acoustic velocity of a bulk wave that propagates through the low acoustic velocity film is lower than an acoustic velocity of a bulk wave that propagates through the piezoelectric layer.

4. The acoustic wave device according to claim 1, wherein the mass addition film includes at least one of silicon oxide, tungsten oxide, niobium pentoxide, tantalum oxide, or hafnium oxide.

5. The acoustic wave device according to claim 1, wherein the mass addition film continuously overlaps at least one of the plurality of electrode fingers and a region between the at least one of the electrode fingers in plan view.

6. The acoustic wave device according to claim 1, wherein the mass addition film is provided between the IDT electrode and the piezoelectric layer.

7. The acoustic wave device according to claim 1, further comprising a dielectric film between the IDT electrode and the piezoelectric layer.

8. The acoustic wave device according to claim 7, wherein the mass addition film is made of a same material as a material of the dielectric film.

9. The acoustic wave device according to claim 1, wherein a thickness of the mass addition film is about 5 nm or more and about 100 nm or less.

10. The acoustic wave device according to claim 1, wherein the mass addition film is a first mass addition film; and a second mass addition film is provided in at least one of the pair of edge regions.

11. The acoustic wave device according to claim 1, wherein the acoustic reflection portion is a cavity portion provided in the support.

12. The acoustic wave device according to claim 1, wherein d/p is about 0.24 or less.

13. The acoustic wave device according to claim 1, wherein when a metallization ratio of the adjacent electrode fingers with respect to the intersection region is MR, MR≤about 1.75 (d/p)+0.075 is satisfied.

14. The acoustic wave device according to claim 1, wherein

Euler angles (φ, θ, φ) of the rotated Y-cut lithium niobate layer as the piezoelectric layer are in a range of Expression (1), Expression (2), or Expression (3):

$$\ldots (0°±10°, 0° \text{ to } 20°, \text{any } φ) \qquad \text{Expression (1)};$$

$$\ldots (0°±10°, 20° \text{ to } 80°, 0° \text{ to } 60° \ (1-(θ-50)^2/900)^{1/2}) \ldots \text{ or } \ldots (0°±10°, 20° \text{ to } 80°, [180°-60°(1-(θ-50)^2/900)^{1/2}] \text{ to } 180°) \qquad \text{Expression (2); and}$$

$$\ldots (0°±10°, [180°-30°(1-(φ-90)^2/8100)^{1/2}] \text{ to } 180°, \text{any } φ) \qquad \text{Expression (3).}$$

15. A filter device comprising:

at least one series arm resonator; and at least one parallel arm resonator; wherein the at least one series arm resonator and the at least one parallel arm resonator each include the acoustic wave device according to claim 1; and a thickness of the mass addition film of the at least one parallel arm resonator is smaller than a thickness of the mass addition film of the at least one series arm resonator.

16. An acoustic wave device comprising:

a support including a support substrate;

a piezoelectric layer on the support and being a rotated Y-cut lithium niobate layer;

an IDT electrode on the piezoelectric layer and including a pair of busbars and a plurality of electrode fingers; and a dielectric film between the IDT electrode and the piezoelectric layer; wherein the support includes an acoustic reflection portion overlapping at least a portion of the IDT electrode in plan view;

d/p is about 0.5 or less, when a thickness of the piezoelectric layer is d and a center-to-center distance of adjacent electrode fingers is p;

at least one of the plurality of electrode fingers are connected to one of the pair of busbars of the IDT electrode, others of the plurality of electrode fingers are connected to another of the pair of busbars, and the at least one of the plurality of electrode fingers connected to the one of the pair of busbars and the others of the plurality of electrode fingers connected to the another of the pair of busbars are interdigitated with each other;

when viewed from a direction in which adjacent electrode fingers of the plurality of electrode fingers face each other, a region where the adjacent electrode fingers overlap each other is an intersection region and a region which is located between the intersection region and the pair of busbars is a pair of gap regions;

a mass addition film is provided in at least a portion of at least one of the pair of gap regions;

when an extending direction of the plurality of electrode fingers is defined as an electrode finger extending direction, the intersection region includes a central region and a pair of edge regions sandwiching the central region in the electrode finger extending direction; and both of the dielectric film and the mass addition film are provided in the at least one of the pair of gap regions, and a total thickness of the dielectric film and the mass addition film in the at least one of pair of gap regions is larger than a thickness of the dielectric film in the central region.

17. The acoustic wave device according to claim 16, further comprising a protective film on the piezoelectric layer and covering the IDT electrode.

18. The acoustic wave device according to claim 17, wherein both of the protective film and the mass addition film are provided in each of the pair of gap regions, and a total thickness of the protective film and the mass addition film in the pair gap regions is larger than a thickness of the protective film in the central region.

19. An acoustic wave device comprising:

a support including a support substrate;

a piezoelectric layer on the support and being a rotated Y-cut lithium niobate layer;

an IDT electrode on the piezoelectric layer and including a pair of busbars and a plurality of electrode fingers;

a protective film on the piezoelectric layer and covering the IDT electrode; wherein the support includes an acoustic reflection portion overlapping at least a portion of the IDT electrode in plan view;

d/p is about 0.5 or less, when a thickness of the piezoelectric layer is d and a center-to-center distance of adjacent electrode fingers is p;

at least one of the plurality of electrode fingers are connected to one of the pair of busbars of the IDT electrode, others of the plurality of electrode fingers are connected to another of the pair of busbars, and the at least one of the plurality of electrode fingers connected to the one of the pair of busbars and the others of the plurality of electrode fingers connected to the another of the pair of busbars are interdigitated with each other;

when viewed from a direction in which adjacent electrode fingers of the plurality of electrode fingers face each other, a region where the adjacent electrode fingers overlap each other is an intersection region and a region which is located between the intersection region and the pair of busbars is a pair of gap regions;

a mass addition film is provided in at least a portion of at least one of the pair of gap regions; and the mass addition film is made of a same material as a material of the protective film.

20. An acoustic wave device comprising:

a support including a support substrate;

a piezoelectric layer on the support and being a rotated Y-cut lithium niobate layer; and an IDT electrode on the piezoelectric layer and including a pair of busbars and a plurality of electrode fingers; wherein the support includes an acoustic reflection portion overlapping at least a portion of the IDT electrode in plan view;

d/p is about 0.5 or less, when a thickness of the piezoelectric layer is d and a center-to-center distance of adjacent electrode fingers is p;

at least one of the plurality of electrode fingers are connected to one of the pair of busbars of the IDT electrode, others of the plurality of electrode fingers are connected to another of the pair of busbars, and the at least one of the plurality of electrode fingers connected to the one of the pair of busbars and the others of the plurality of electrode fingers connected to the another of the pair of busbars are interdigitated with each other;

when viewed from a direction in which adjacent electrode fingers of the plurality of electrode fingers face each other, a region where the adjacent electrode fingers overlap each other is an intersection region and a region which is located between the intersection region and the pair of busbars is a pair of gap regions;

a mass addition film is provided in at least a portion of at least one of the pair of gap regions; and when an extending direction of the plurality of electrode fingers is defined as an electrode finger extending direction, a dimension of each of the pair of gap regions along the electrode finger extending direction is about 1 μm or more and about 5 μm or less.

21. An acoustic wave device comprising:

a support including a support substrate;

a piezoelectric layer on the support and being a rotated Y-cut lithium niobate layer; and an IDT electrode on the piezoelectric layer and including a pair of busbars and a plurality of electrode fingers; wherein the support includes an acoustic reflection portion overlapping at least a portion of the IDT electrode in plan view;

d/p is about 0.5 or less, when a thickness of the piezoelectric layer is d and a center-to-center distance of adjacent electrode fingers is p;

at least one of the plurality of electrode fingers are connected to one of the pair of busbars of the IDT electrode, others of the plurality of electrode fingers are connected to another of the pair of busbars, and the at least one of the plurality of electrode fingers connected to the one of the pair of busbars and the others of the plurality of electrode fingers connected to the another of the pair of busbars are interdigitated with each other;

when viewed from a direction in which adjacent electrode fingers of the plurality of electrode fingers face each other, a region where the adjacent electrode fingers overlap each other is an intersection region and a region which is located between the intersection region and the pair of busbars is a pair of gap regions;

a mass addition film is provided in at least a portion of at least one of the pair of gap regions; and a thickness y of the mass addition film is y≥about 5x+5, when an extending direction of the plurality of electrode fingers is defined as an electrode finger extending direction, a dimension of each of the pair of gap regions along the electrode finger extending direction is x, and a thickness of the mass addition film is y.

22. The acoustic wave device according to claim 21, wherein the thickness y of the mass addition film is about 5x+5≤y≤75 nm.

*   *   *   *   *